United States Patent
Khlat et al.

(10) Patent No.: US 9,294,041 B2
(45) Date of Patent: Mar. 22, 2016

(54) AVERAGE FREQUENCY CONTROL OF SWITCHER FOR ENVELOPE TRACKING

(71) Applicant: RF Micro Devices, Inc., Greensboro, NC (US)

(72) Inventors: Nadim Khlat, Midi-Pyrenees (FR); Christopher Truong Ngo, Queen Creek, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 509 days.

(21) Appl. No.: 13/661,164

(22) Filed: Oct. 26, 2012

(65) Prior Publication Data
US 2013/0107769 A1     May 2, 2013

Related U.S. Application Data

(60) Provisional application No. 61/551,587, filed on Oct. 26, 2011, provisional application No. 61/591,552, filed on Jan. 27, 2012.

(51) Int. Cl.
*H03F 1/30*       (2006.01)
*H03F 1/02*       (2006.01)
(Continued)

(52) U.S. Cl.
CPC ............. *H03F 1/0227* (2013.01); *H02M 3/156* (2013.01); *H03F 3/19* (2013.01); *H03F 2200/108* (2013.01); *H03F 2200/351* (2013.01)

(58) Field of Classification Search
CPC ............. H03F 1/30; H03F 3/217; H03F 3/38
USPC ................................ 330/297, 251, 207 A, 10
See application file for complete search history.

(56) References Cited

U.S. PATENT DOCUMENTS

| | | |
|---|---|---|
| 3,969,682 A | 7/1976 | Rossum |
| 3,980,964 A | 9/1976 | Grodinsky |

(Continued)

FOREIGN PATENT DOCUMENTS

| | | |
|---|---|---|
| CN | 1211355 A | 3/1999 |
| CN | 1898860 A | 1/2007 |

(Continued)

OTHER PUBLICATIONS

Dixon, N., "Standardization boosts momentum for Envelope tracking," Microwave Engineers, Europe, Apr. 20, 2011, 2 pages.

(Continued)

*Primary Examiner* — Henry Choe
(74) *Attorney, Agent, or Firm* — Withrow & Terranova, P.L.L.C.

(57) ABSTRACT

This disclosure relates generally to radio frequency (RF) switching converters and RF amplification devices that use RF switching converters. For example, an RF switching converter may include a switching circuit that receives a power source voltage and a switching controller that receives a target average frequency value identifying a target average frequency. The switching circuit is switchable so as to generate a pulsed output voltage from the power source voltage. The switching controller switches the switching circuit such that the pulsed output voltage has an average pulse frequency. The switching controller also detects that the average pulse frequency of the pulsed output voltage during a time period differs from the target average frequency, and reduces a difference between the average pulse frequency and the target average frequency. In this manner, the effects of manufacturing variations and operational variations on the average pulse frequency can be eliminated, or at least diminished.

28 Claims, 11 Drawing Sheets

(51) Int. Cl.
*H03F 3/19* (2006.01)
*H02M 3/156* (2006.01)

(56) References Cited

U.S. PATENT DOCUMENTS

| | | |
|---|---|---|
| 4,587,552 A | 5/1986 | Chin |
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,351,087 A | 9/1994 | Christopher et al. |
| 5,414,614 A | 5/1995 | Fette et al. |
| 5,420,643 A | 5/1995 | Romesburg et al. |
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,133,777 A | 10/2000 | Savelli |
| 6,141,541 A | 10/2000 | Midya et al. |
| 6,147,478 A | 11/2000 | Skelton et al. |
| 6,166,598 A | 12/2000 | Schlueter |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 | 6/2002 | Gourgue et al. |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,099,635 B2 | 8/2006 | McCune |
| 7,164,893 B2 | 1/2007 | Leizerovich et al. |
| 7,170,341 B2 | 1/2007 | Conrad et al. |
| 7,200,365 B2 | 4/2007 | Watanabe et al. |
| 7,233,130 B1 | 6/2007 | Kay |
| 7,253,589 B2 | 8/2007 | Potanin et al. |
| 7,254,157 B1 | 8/2007 | Crotty et al. |
| 7,262,658 B2 * | 8/2007 | Ramaswamy et al. ........ 330/251 |
| 7,279,875 B2 | 10/2007 | Gan et al. |
| 7,304,537 B2 | 12/2007 | Kwon et al. |
| 7,348,847 B2 | 3/2008 | Whittaker |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,454,238 B2 | 11/2008 | Vinayak et al. |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,755,431 B2 | 7/2010 | Sun |
| 7,764,060 B2 | 7/2010 | Wilson |
| 7,773,691 B2 | 8/2010 | Khlat et al. |
| 7,773,965 B1 | 8/2010 | Van Brunt et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,852,150 B1 | 12/2010 | Arknaes-Pedersen |
| 7,856,048 B1 | 12/2010 | Smaini et al. |
| 7,859,336 B2 | 12/2010 | Markowski et al. |
| 7,880,547 B2 | 2/2011 | Lee et al. |
| 7,884,681 B1 | 2/2011 | Khlat et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,920,023 B2 * | 4/2011 | Witchard ................ 330/10 |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,054,126 B2 | 11/2011 | Yang et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice et al. |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |
| 8,274,332 B2 | 9/2012 | Cho et al. |
| 8,289,084 B2 | 10/2012 | Morimoto et al. |
| 8,362,837 B2 | 1/2013 | Koren et al. |
| 8,493,141 B2 | 7/2013 | Khlat et al. |
| 8,519,788 B2 | 8/2013 | Khlat |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,571,498 B2 | 10/2013 | Khlat |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |

(56) References Cited

U.S. PATENT DOCUMENTS

| | | |
|---|---|---|
| 8,624,760 B2 | 1/2014 | Ngo et al. |
| 8,626,091 B2 | 1/2014 | Khlat et al. |
| 8,633,766 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,693,676 B2 | 4/2014 | Xiao et al. |
| 8,717,100 B2 | 5/2014 | Reisner et al. |
| 8,718,579 B2 | 5/2014 | Drogi |
| 8,718,582 B2 | 5/2014 | See et al. |
| 8,725,218 B2 | 5/2014 | Brown et al. |
| 8,744,382 B2 | 6/2014 | Hou et al. |
| 8,749,307 B2 | 6/2014 | Zhu et al. |
| 8,760,228 B2 | 6/2014 | Khlat |
| 8,782,107 B2 | 7/2014 | Myara et al. |
| 8,792,840 B2 | 7/2014 | Khlat et al. |
| 8,803,605 B2 | 8/2014 | Fowers et al. |
| 8,824,978 B2 | 9/2014 | Briffa et al. |
| 8,829,993 B2 | 9/2014 | Briffa et al. |
| 8,878,606 B2 | 11/2014 | Khlat et al. |
| 8,884,696 B2 | 11/2014 | Langer |
| 8,909,175 B1 | 12/2014 | McCallister |
| 8,942,313 B2 | 1/2015 | Khlat et al. |
| 8,942,651 B2 | 1/2015 | Jones |
| 8,942,652 B2 | 1/2015 | Khlat et al. |
| 8,947,161 B2 | 2/2015 | Khlat et al. |
| 8,947,162 B2 | 2/2015 | Wimpenny et al. |
| 8,952,710 B2 | 2/2015 | Retz et al. |
| 8,957,728 B2 | 2/2015 | Gorisse |
| 8,975,959 B2 | 3/2015 | Khlat |
| 8,981,839 B2 | 3/2015 | Kay et al. |
| 8,981,847 B2 | 3/2015 | Balteanu |
| 8,981,848 B2 | 3/2015 | Kay et al. |
| 8,994,345 B2 | 3/2015 | Wilson |
| 9,019,011 B2 | 4/2015 | Hietala et al. |
| 9,020,451 B2 | 4/2015 | Khlat |
| 9,024,688 B2 | 5/2015 | Kay et al. |
| 9,041,364 B2 | 5/2015 | Khlat |
| 9,041,365 B2 | 5/2015 | Kay et al. |
| 9,075,673 B2 | 7/2015 | Khlat et al. |
| 9,077,405 B2 | 7/2015 | Jones et al. |
| 9,099,961 B2 | 8/2015 | Kay et al. |
| 9,112,452 B1 | 8/2015 | Khlat |
| 2002/0071497 A1 | 6/2002 | Bengtsson et al. |
| 2003/0017286 A1 | 1/2003 | Williams et al. |
| 2003/0031271 A1 | 2/2003 | Bozeki et al. |
| 2003/0062950 A1 | 4/2003 | Hamada et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0127173 A1 | 7/2004 | Leizerovich |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0032599 A1 | 2/2005 | Gassmann |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0147062 A1 | 7/2006 | Niwa et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0024365 A1* | 2/2007 | Ramaswamy et al. ........ 330/251 |
| 2007/0063681 A1 | 3/2007 | Liu |
| 2007/0082622 A1 | 4/2007 | Leinonen et al. |
| 2007/0146076 A1 | 6/2007 | Baba |
| 2007/0159256 A1 | 7/2007 | Ishikawa et al. |
| 2007/0182392 A1 | 8/2007 | Nishida |
| 2007/0183532 A1 | 8/2007 | Matero |
| 2007/0184794 A1 | 8/2007 | Drogi et al. |
| 2007/0249304 A1 | 10/2007 | Snelgrove et al. |
| 2007/0259628 A1 | 11/2007 | Carmel et al. |
| 2007/0290749 A1 | 12/2007 | Woo et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0224769 A1 | 9/2008 | Markowski et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0259656 A1 | 10/2008 | Grant |
| 2008/0280577 A1 | 11/2008 | Beukema et al. |
| 2009/0004981 A1 | 1/2009 | Eliezer et al. |
| 2009/0045872 A1 | 2/2009 | Kenington |
| 2009/0082006 A1 | 3/2009 | Pozsgay et al. |
| 2009/0097591 A1 | 4/2009 | Kim |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0002473 A1 | 1/2010 | Williams |
| 2010/0017553 A1 | 1/2010 | Laurencin et al. |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0045247 A1 | 2/2010 | Blanken et al. |
| 2010/0253309 A1 | 10/2010 | Xi et al. |
| 2010/0266066 A1 | 10/2010 | Takahashi |
| 2010/0289568 A1 | 11/2010 | Eschauzier et al. |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2011/0018626 A1 | 1/2011 | Kojima |
| 2011/0058601 A1 | 3/2011 | Kim et al. |
| 2011/0084760 A1 | 4/2011 | Guo et al. |
| 2011/0109387 A1 | 5/2011 | Lee |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0260706 A1 | 10/2011 | Nishijima |
| 2011/0279180 A1 | 11/2011 | Yamanouchi et al. |

(56) References Cited

U.S. PATENT DOCUMENTS

| | | |
|---|---|---|
| 2011/0298433 A1 | 12/2011 | Tam |
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049894 A1 | 3/2012 | Berchtold et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0098595 A1 | 4/2012 | Stockert |
| 2012/0119813 A1 | 5/2012 | Khlat et al. |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli |
| 2012/0170690 A1 | 7/2012 | Ngo et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0244916 A1 | 9/2012 | Brown et al. |
| 2012/0269240 A1 | 10/2012 | Balteanu et al. |
| 2012/0299647 A1 | 11/2012 | Honjo et al. |
| 2013/0024142 A1 | 1/2013 | Folkmann et al. |
| 2013/0034139 A1 | 2/2013 | Khlat et al. |
| 2013/0094553 A1 | 4/2013 | Paek et al. |
| 2013/0106378 A1 | 5/2013 | Khlat |
| 2013/0134956 A1 | 5/2013 | Khlat |
| 2013/0135043 A1 | 5/2013 | Hietala et al. |
| 2013/0141064 A1 | 6/2013 | Kay et al. |
| 2013/0141068 A1 | 6/2013 | Kay et al. |
| 2013/0141072 A1 | 6/2013 | Khlat et al. |
| 2013/0141169 A1 | 6/2013 | Khlat et al. |
| 2013/0147445 A1 | 6/2013 | Levesque et al. |
| 2013/0154729 A1 | 6/2013 | Folkmann et al. |
| 2013/0169245 A1 | 7/2013 | Kay et al. |
| 2013/0181521 A1 | 7/2013 | Khlat |
| 2013/0214858 A1 | 8/2013 | Tournatory et al. |
| 2013/0229235 A1 | 9/2013 | Ohnishi |
| 2013/0238913 A1 | 9/2013 | Huang et al. |
| 2013/0271221 A1 | 10/2013 | Levesque et al. |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 | 1/2014 | Wimpenny |
| 2014/0028392 A1 | 1/2014 | Wimpenny |
| 2014/0049321 A1 | 2/2014 | Gebeyehu et al. |
| 2014/0055197 A1 | 2/2014 | Khlat et al. |
| 2014/0057684 A1 | 2/2014 | Khlat |
| 2014/0062590 A1 | 3/2014 | Khlat et al. |
| 2014/0077787 A1 | 3/2014 | Gorisse et al. |
| 2014/0097895 A1 | 4/2014 | Khlat et al. |
| 2014/0099906 A1 | 4/2014 | Khlat |
| 2014/0099907 A1 | 4/2014 | Chiron |
| 2014/0103995 A1 | 4/2014 | Langer |
| 2014/0111178 A1 | 4/2014 | Khlat et al. |
| 2014/0125408 A1 | 5/2014 | Kay et al. |
| 2014/0139199 A1 | 5/2014 | Khlat et al. |
| 2014/0184335 A1 | 7/2014 | Nobbe et al. |
| 2014/0203868 A1 | 7/2014 | Khlat et al. |
| 2014/0203869 A1 | 7/2014 | Khlat et al. |
| 2014/0225674 A1 | 8/2014 | Folkmann et al. |
| 2014/0266427 A1 | 9/2014 | Chiron |
| 2014/0266428 A1 | 9/2014 | Chiron et al. |
| 2014/0306769 A1 | 10/2014 | Khlat et al. |
| 2015/0048891 A1 | 2/2015 | Rozek et al. |
| 2015/0180422 A1 | 6/2015 | Khlat et al. |

FOREIGN PATENT DOCUMENTS

| | | |
|---|---|---|
| CN | 101106357 A | 1/2008 |
| CN | 101201891 A | 6/2008 |
| CN | 101379695 A | 3/2009 |
| CN | 101405671 A | 4/2009 |
| CN | 101416385 A | 4/2009 |
| CN | 101427459 A | 5/2009 |
| CN | 101548476 A | 9/2009 |
| CN | 101669280 A | 3/2010 |
| CN | 101867284 A | 10/2010 |
| CN | 201674399 U | 12/2010 |
| EP | 0755121 A2 | 1/1997 |
| EP | 1047188 A2 | 10/2000 |
| EP | 1317105 A1 | 6/2003 |
| EP | 1492227 A1 | 12/2004 |
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| TW | 461168 B | 10/2001 |
| WO | 0048306 A1 | 8/2000 |
| WO | 2004002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.

Kim, N. et al, "Ripple feedback filter suitable for analog/digital mixed-mode audio amplifier for improved efficiency and stability," 33rd Annual Power Electronics Specialists Conference, vol. 1, Jun. 23, 2002, pp. 45-49.

Kim et al., "High Efficiency and Wideband Envelope Tracking Power Amplifier with Sweet Spot Tracking," 2010 IEEE Radio Frequency Integrated Circuits Symposium, May 23-25, 2010, pp. 255-258.

Knutson, P, et al., "An Optimal Approach to Digital Raster Mapper Design," 1991 IEEE Transactions on Consumer Electronics held Jun. 5-7, 1991, vol. 37, Issue 4, published Nov. 1991, pp. 746-752.

Le, Hanh-Phuc et al., "A 32nm Fully Integrated Reconfigurable Switched-Capacitor DC-DC Convertor Delivering 0.55W/mm2 at 81% Efficiency," 2010 IEEE International Solid State Circuits Conference, Feb. 7-11, 2010, pp. 210-212.

Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.

Unknown, "Nujira files 100th envelope tracking patent," CS: Compound Semiconductor, Apr. 11, 2011, 1 page.

Non-final Office Action for U.S. Appl. No. 12/112,006 mailed Apr. 5, 2010, now U.S. Pat. No. 7,884,681, 6 pages.

Notice of Allowance for U.S. Appl. No. 12/112,006 mailed Jul. 19, 2010, 6 pages.

International Search Report for PCT/US11/033037 mailed Aug. 9, 2011, 10 pages.

International Search Report for PCT/US2011/044857 mailed Oct. 24, 2011, 10 pages.

International Search Report for PCT/US11/49243 mailed Dec. 22, 2011, 9 pages.

International Search Report for PCT/US2011/064255 mailed Apr. 3, 2012, 12 pages.

Non-final Office Action for U.S. Appl. No. 11/113,873, now U.S. Pat. No. 7,773,691 mailed Feb. 1, 2008, 17 pages.

(56) References Cited

OTHER PUBLICATIONS

Final Office Action for U.S. Appl. No. 11/113,873, now U.S. Pat. No. 7,773,691, mailed Jul. 30, 2008, 19 pages.
Non-final Office Action for U.S. Appl. No. 11/113,873, now U.S. Pat. No. 7,773,691, mailed Nov. 26, 2008, 22 pages.
Final Office Action for U.S. Appl. No. 11/113,873, now U.S. Pat. No. 7,773,691, mailed May 4, 2009, 20 pages.
Non-final Office Action for U.S. Appl. No. 11/113,873, now U.S. Pat. No. 7,773,691, mailed Feb. 3, 2010, 21 pages.
Notice of Allowance for U.S. Appl. No. 11/113,873, now U.S. Pat. No. 7,773,691, mailed Jun. 9, 2010, 7 pages.
International Search Report for PCT/US06/12619 mailed May 8, 2007, 2 pages.
Extended European Search Report for application 06740532.4 mailed Dec. 7, 2010, 7 pages.
International Search Report for PCT/US2011/061009 mailed Feb. 8, 2012, 14 pages.
International Search Report for PCT/US2012/023495 mailed May 7, 2012, 13 pages.
Invitation to Pay Additional Fees and Where Applicable Protest Fee for PCT/US2011/061007 mailed Feb. 13, 2012, 7 pages.
Hekkala, A. et al., "Adaptive time misalignment compensation in envelope tracking amplifiers," International Symposium on Spread Spectrum Techniques and Applications, Aug. 2008, pp. 761-765.
Invitation to Pay Additional Fees and Where Applicable Protest Fee for PCT/US2012/024124 mailed Jun. 1, 2012, 7 pages.
Li et al., "A highly efficient SiGe differential power amplifier using an envelope-tracking technique for 3GPP LTE applications," IEEE Bipolar/BiCMOS Circuits and Technology Meeting (BCTM), Oct. 4-6, 2010, pp. 121-124.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
International Search Report for PCT/US2011/061007 mailed Aug. 16, 2012, 16 pages.
International Search Report for PCT/US2012/024124 mailed Aug. 24, 2012, 14 pages.
Non-final Office Action for U.S. Appl. No. 13/218,400 mailed Nov. 8, 2012, 7 pages.
Notice of Allowance for U.S. Appl. No. 13/316,229 mailed Nov. 14, 2012, 9 pages.
Non-final Office Action for U.S. Appl. No. 13/222,484 mailed Nov. 8, 2012, 9 pages.
International Preliminary Report on Patentability for PCT/US11/49243 mailed Nov. 13, 2012, 33 pages.
Non-final Office Action for U.S. Appl. No. 13/089,917 mailed Nov. 23, 2012, 6 pages.
International Preliminary Report on Patentability for PCT/US2011/033037 mailed Oct. 23, 2012, 7 pages.
Non final Office Action for U.S. Appl. No. 13/222,453 mailed Dec. 6, 2012, 13 pages.
Notice of Allowance for U.S. Appl. No. 13/948,291, mailed Feb. 11, 2015, 7 pages.
First Office Action for Chinese Patent Application No. 2011800302735, issued Dec. 3, 2014, 15 pages (with English translation).
Notice of Allowance for U.S. Appl. No. 14/022,858, mailed Feb. 17, 2015, 7 pages.
Notice of Allowance for U.S. Appl. No. 14/072,225, mailed Jan. 22, 2015, 7 pages.
Final Office Action for U.S. Appl. No. 13/661,227, mailed Feb. 6, 2015, 24 pages.
International Preliminary Report on Patentability for PCT/US2013/052277, mailed Feb. 5, 2015, 9 pages.
Non-Final Office Action for U.S. Appl. No. 14/048,109, mailed Feb. 18, 2015, 8 pages.
Notice of Allowance for U.S Appl. No. 13/747,725, mailed Feb. 2, 2015, 10 pages.
European Search Report for Patent Application No. 14162682.0, issued Aug. 27, 2014, 7 pages.
Notice of Allowance for U.S. Appl. No. 14/072,140, mailed Aug. 27, 2014, 8 pages.
Non-Final Office Action for U.S. Appl. No. 14/072,225, mailed Aug. 15, 2014, 4 pages.
Notice of Allowance for U.S. Appl. No. 13/548,283, mailed Sep. 3, 2014, 7 pages.
Non-Final Office Action for U.S. Appl. No. 13/689,883, mailed Aug. 27, 2014, 12 pages.
Notice of Allowance for U.S. Appl. No. 13/690,187, mailed Sep. 3, 2014, 9 pages.
Non-Final Office Action for U.S. Appl. No. 13/782,142, mailed Sep. 4, 2014, 6 pages.
Invitation to Pay Additional Fees and Partial International Search Report for PCT/US2014/028178, mailed Jul. 24, 2014, 7 pages.
Notice of Allowance for U.S. Appl. No. 14/072,140, mailed Dec. 2, 2014, 8 pages.
First Office Action for Chinese Patent Application No. 2012800265590, issued Nov. 3, 2014, 14 pages (with English translation).
Notice of Allowance for U.S. Appl. No. 13/486,012, mailed Nov. 21, 2014, 8 pages.
Final Office Action for U.S. Appl. No. 13/689,883, mailed Jan. 2, 2015, 13 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Notice of Allowance for U.S. Appl. No. 13/951,976, mailed Dec. 26, 2014, 9 pages.
Non-Final Office Action for U.S. Appl. No. 13/747,749, mailed Nov. 12, 2014, 32 pages.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, 7 pages.
International Preliminary Report on Patentability for PCT/US2012/040317, mailed Dec. 12, 2013, 5 pages.
Notice of Allowance for U.S. Appl. No. 13/531,719, mailed Dec. 30, 2013, 7 pages.
Non-Final Office Action for U.S. Appl. No. 13/550,049, mailed Nov. 25, 2013, 6 pages.
Non-Final Office Action for U.S. Appl. No. 14/022,940, mailed Dec. 20, 2013, 5 pages.
International Search Report and Written Opinion for PCT/US2013/052277, mailed Jan. 7, 2014, 14 pages.
Notice of Allowance for U.S. Appl. No. 13/297,490, mailed Feb. 27, 2014, 7 pages.
Non-Final Office Action for U.S. Appl. No. 13/297,470, mailed Feb. 20, 2014, 16 pages.
Notice of Allowance for U.S. Appl. No. 13/550,049, mailed Mar. 6, 2014, 5 pages.
International Preliminary Report on Patentability for PCT/US2012/046887, mailed Jan. 30, 2014, 8 pages.
International Preliminary Report on Patentability for PCT/US2012/053654, mailed Mar. 13, 2014, 7 pages.
Non-Final Office Action for U.S. Appl. No. 13/661,552, mailed Feb. 21, 2014, 5 pages.
International Search Report and Written Opinion for PCT/US2013/065403, mailed Feb. 5, 2014, 11 pages.
Non-Final Office Action for U.S. Appl. No. 13/188,024, mailed Feb. 5, 2013, 8 pages.
Notice of Allowance for U.S. Appl. No. 13/188,024, mailed Jun. 18, 2013, 7 pages.
International Preliminary Report on Patentability for PCT/US2011/044857 mailed Mar. 7, 2013, 6 pages.
Notice of Allowance for U.S. Appl. No. 13/218,400 mailed Apr. 11, 2013, 7 pages.

(56) References Cited

OTHER PUBLICATIONS

International Search Report for PCT/US2011/054106 mailed Feb. 9, 2012, 11 pages.
International Preliminary Report on Patentability for PCT/US2011/054106 mailed Apr. 11, 2013, 8 pages.
International Preliminary Report on Patentability for PCT/US2011/061007 mailed May 30, 2013, 11 pages.
Non-Final Office Action for U.S. Appl. No. 13/297,470 mailed May 8, 2013, 15 pages.
International Preliminary Report on Patentability for PCT/US2011/061009 mailed May 30, 2013, 10 pages.
Notice of Allowance for U.S. Appl. No. 13/222,453 mailed Feb. 21, 2013, 7 pages.
Non-Final Office Action for U.S. Appl. No. 13/423,649, mailed May 22, 2013, 7 pages.
International Search Report for PCT/US2012/40317 mailed Sep. 7, 2012, 7 pages.
International Search Report for PCT/US2012/046887 mailed Dec. 21, 2012, 12 pages.
Final Office Action for U.S. Appl. No. 13/222,484 mailed Apr. 10, 2013, 10 pages.
Advisory Action for U.S. Appl. No. 13/222,484, mailed Jun. 14, 2013, 3 pages.
International Search Report and Written Opinion for PCT/US2012/053654 mailed Feb. 15, 2013, 11 pages.
International Search Report and Written Opinion for PCT/US2012/062070, mailed Jan. 21, 2013, 12 pages.
International Search Report and Written Opinion for PCT/US2012/067230 mailed Feb. 21, 2013, 10 pages.
International Preliminary Report on Patentability for PCT/US2011/064255, mailed Jun. 20, 2013, 7 pages.
Notice of Allowance for U.S. Appl. No. 13/343,840, mailed Jul. 1, 2013, 8 pages.
International Preliminary Report on Patentability for PCT/US2012/024124, mailed Aug. 22, 2013, 8 pages.
International Preliminary Report on Patentability for PCT/US2012/023495, mailed Aug. 15, 2013, 10 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Extended European Search Report for European Patent Application No. 12794149.0, issued Oct. 29, 2014, 6 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
Notice of Allowance for U.S. Appl. No. 12/836,307 mailed May 5, 2014, 6 pages.
Notice of Allowance for U.S. Appl. No. 14/022,858 mailed May 27, 2014, 6 pages.
Non-Final Office Action for U.S. Appl. No. 13/367,973 mailed Apr. 25, 2014, 5 pages.
Non-Final Office Action for U.S. Appl. No. 13/647,815 mailed May 2, 2014, 6 pages.
Non-Final Office Action for U.S. Appl. No. 13/689,883 mailed Mar. 27, 2014, 13 pages.
Non-Final Office Action for U.S. Appl. No. 13/692,084 mailed Apr. 10, 2014, 6 pages.
Non-Final Office Action for U.S. Appl. No. 13/684,826 mailed Apr. 3, 2014, 5 pages.
Notice of Allowance for U.S. Appl. No. 14/022,940, mailed Jun. 10, 2014, 7 pages.
Non-Final Office Action for U.S. Appl. No. 13/714,600 mailed May 9, 2014, 14 pages.
Non-Final Office Action for U.S. Appl. No. 13/951,976 mailed Apr. 4, 2014, 7 pages.
Invitation pursuant to Article 94(3) and Rule 71(1) EPC for European Patent Application No. 11720630.0 issued Mar. 18, 2014, 4 pages.
International Preliminary Report on Patentability for PCT/US2012/062070 mailed May 8, 2014, 8 pages.
International Search Report and Written Opinion for PCT/US2012/062110 issued Apr. 8, 2014, 12 pages.
International Preliminary Report on Patentability for PCT/US2012/062110 mailed May 8, 2014, 9 pages.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 1, 2012, pp. 1185-1198.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
Non-Final Office Action for U.S. Appl. No. 13/486,012, mailed Jul. 28, 2014, 7 pages.
Notice of Allowance for U.S. Appl. No. 13/661,552, mailed Jun. 13, 2014, 5 pages.
Notice of Allowance for U.S. Appl. No. 13/692,084, mailed Jul. 23, 2014, 7 pages.
International Preliminary Report on Patentability and Written Opinion for PCT/US2012/067230, mailed Jun. 12, 2014, 7 pages.
Notice of Allowance for U.S. Appl. No. 13/684,826, mailed Jul. 18, 2014, 7 pages.
International Search Report and Written Opinion for PCT/US2014/028089, mailed Jul. 17, 2014, 10 pages.
Notice of Allowance for U.S. Appl. No. 12/836,307, mailed Mar. 2, 2015, 6 pages.
Notice of Allowance for U.S. Appl. No. 13/297,470, mailed Feb. 25, 2015, 15 pages.
Corrected Notice of Allowance for U.S. Appl. No. 13/297,470, mailed Apr. 6, 2015, 11 pages.
European Search Report for European Patent Application No. 14190851.7, issued Mar. 5, 2015, 6 pages.
Non-Final Office Action for U.S. Appl. No. 14/122,852, mailed Feb. 27, 2015, 5 pages.
Final Office Action for U.S. Appl. No. 13/714,600, mailed Mar. 10, 2015, 14 pages.
Non-Final Office Action for U.S. Appl. No. 14/056,292, mailed Mar. 6, 2015, 8 pages.
Final Office Action for U.S. Appl. No. 13/747,749, mailed Mar. 20, 2015, 35 pages.
Non-Final Office Action for U.S. Appl. No. 14/072,120, mailed Apr. 14, 2015, 8 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.

(56) References Cited

OTHER PUBLICATIONS

Non-Final Office Action for U.S. Appl. No. 13/367,973, mailed Sep. 24, 2013, 8 pages.
Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Quayle Action for U.S. Appl. No. 13/531,719, mailed Oct. 10, 2013, 5 pages.
Notice of Allowance for U.S. Appl. No. 13/550,060, mailed Aug. 16, 2013, 8 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
Notice of Allowance for U.S. Appl. No. 14/022,858, mailed Oct. 25, 2013, 9 pages.
Non-Final Office Action for U.S. Appl. No. 12/836,307, mailed Nov. 5, 2013, 6 pages.
Examination Report for European Patent Application No. 11720630.0, mailed Aug. 16, 2013, 5 pages.
Final Office Action for U.S. Appl. No. 13/297,470, mailed Oct. 25, 2013, 17 pages.
European Examination Report for European Patent Application No. 14162682.0, mailed May 22, 2015, 5 pages.
Corrected Notice of Allowance for U.S. Appl. No. 13/297,470, mailed Jun. 5, 2015, 11 pages.
Advisory Action for U.S. Appl. No. 13/689,883, mailed Apr. 20, 2015, 3 pages.
Advisory Action for U.S. Appl. No. 13/661,227, mailed May 12, 2015, 3 pages.
Advisory Action for U.S. Appl. No. 13/714,600, mailed May 26, 2015, 3 pages.
Notice of Allowance for U.S. Appl. No. 13/747,725, mailed May 13, 2015, 9 pages.
Notice of Allowance for U.S. Appl. No. 13/747,749, mailed Jun. 4, 2015, 8 pages.
Non-Final Office Action for U.S. Appl. No. 13/552,768, mailed Apr. 20, 2015, 12 pages.
Non-Final Office Action for U.S. Appl. No. 13/689,922, mailed Apr. 20, 2015, 19 pages.
Non-Final Office Action for U.S. Appl. No. 13/727,911, mailed Apr. 20, 2015, 10 pages.
Non-Final Office Action for U.S. Appl. No. 14/163,229, mailed Apr. 23, 2015, 9 pages.
Non-Final Office Action for U.S. Appl. No. 14/163,256, mailed Apr. 23, 2015, 9 pages.
Notice of Allowance for U.S. Appl. No. 14/176,611, mailed Apr. 27, 2015, 7 pages.
International Preliminary Report on Patentability for PCT/US2013/065403, mailed Apr. 30, 2015, 8 pages.
Non-Final Office Action for U.S. Appl. No. 13/689,940, mailed May 14, 2015, 7 pages.
Non-Final Office Action for U.S. Appl. No. 14/082,629, mailed Jun. 18, 2015, 15 pages.
First Office Action for Chinese Patent Application No. 201280052694.2, issued Mar. 24, 2015, 35 pages.
Notice of Allowance for U.S. Appl. No. 13/948,291, mailed Jul. 17, 2015, 8 pages.
Non-Final Office Action for U.S. Appl. No. 13/689,883, mailed Jul. 24, 2015, 13 pages.
Non-Final Office Action for U.S. Appl. No. 13/661,227, mailed Jul. 27, 2015, 25 pages.
Non-Final Office Action for U.S. Appl. No. 13/714,600, mailed Jul. 17, 2015, 14 pages.
Notice of Allowance for U.S. Appl. No. 14/212,154, mailed Jul. 17, 2015, 8 pages.
Notice of Allowance for U.S. Appl. No. 14/212,199, mailed Jul. 20, 2015, 8 pages.
Notice of Allowance for U.S. Appl. No. 14/072,120, mailed Jul. 30, 2015, 7 pages.
Notice of Allowance for U.S. Appl. No. 13/689,940, mailed Aug. 3, 2015, 6 pages.
First Office Action and Search Report for Chinese Patent Application No. 201280007941.7, issued May 13, 2015, 13 pages.
Yun, Hu et al., "Study of envelope tracking power amplifier design," Journal of Circuits and Systems, vol. 15, No. 6, Dec. 2010, pp. 6-10.
Notice of Allowance for U.S. Appl. No. 14/072,140, mailed Aug. 20, 2015, 6 pages.
Non-Final Office Action for U.S. Appl. No. 14/072,225, mailed Aug. 18, 2015, 4 pages.
Notice of Allowance for U.S. Appl. No. 13/747,725, mailed Sep. 1, 2015, 9 pages.
Notice of Allowance for U.S. Appl. No. 13/747,749, mailed Oct. 2, 2015, 8 pages.
Notice of Allowance for U.S. Appl. No. 13/552,768, mailed Sep. 22, 2015, 9 pages.
Final Office Action for U.S. Appl. No. 13/689,922, mailed Oct. 6, 2015, 20 pages.
Notice of Allowance for U.S. Appl. No. 13/727,911, mailed Sep. 14, 2015, 8 pages.
Notice of Allowance for U.S. Appl. No. 14/027,416, mailed Aug. 11, 2015, 9 pages.
Notice of Allowance for U.S. Appl. No. 13/689,940, mailed Sep. 16, 2015, 7 pages.
Non-Final Office Action for U.S. Appl. No. 14/101,770, mailed Sep. 21, 2015, 5 pages.
Non-Final Office Action for U.S. Appl. No. 14/702,192, mailed Oct. 7, 2015, 7 pages.
Non-Final Office Action for U.S. Appl. No. 14/254,215, mailed Oct. 15, 2015, 5 pages.
Second Office Action for Chinese Patent Application No. 201180030273.5, issued Aug. 14, 2015, 8 pages.
International Preliminary Report on Patentability for PCT/US2014/012927, mailed Aug. 6, 2015, 9 pages.
International Preliminary Report on Patentability for PCT/US2014/028089, mailed Sep. 24, 2015, 8 pages.
International Preliminary Report on Patentability for PCT/US2014/028178, mailed Sep. 24, 2015, 11 pages.
First Office Action for Chinese Patent Application No. 201180067293.X, mailed Aug. 6, 2015, 13 pages.
Author Unknown, "Automatically," Definition, Dictionary.com Unabridged, 2015, pp. 1-6, http://dictionary.reference.com/browse/automatically.
Final Office Action for U.S. Appl. No. 13/689,883, mailed Dec. 23, 2015, 12 pages.
Final Office Action for U.S. Appl. No. 13/714,600, mailed Dec. 24, 2015, 15 pages.
Notice of Allowance for U.S. Appl. No. 13/747,725, mailed Oct. 28, 2015, 9 pages.
Advisory Action for U.S. Appl. No. 13/689,922, mailed Dec. 18, 2015, 3 pages.
Notice of Allowance for U.S. Appl. No. 13/727,911, mailed Nov. 10, 2015, 8 pages.
Notice of Allowance for U.S. Appl. No. 14/163,229, mailed Nov. 5, 2015, 8 pages.
Final Office Action for U.S. Appl. No. 14/163,256, mailed Nov. 2, 2015, 10 pages.
Corrected Notice of Allowability for U.S. Appl. No. 13/689,940, mailed Nov. 17, 2015, 4 pages.
Final Office Action for U.S. Appl. No. 14/082,629, mailed Nov. 4, 2015, 17 pages.
Non-Final Office Action for U.S. Appl. No. 14/458,341, mailed Nov. 12, 2015, 5 pages.

\* cited by examiner

AVERAGE FREQUENCY CONTROL OF SWITCHER FOR ENVELOPE TRACKING

RELATED APPLICATIONS

This application claims the benefit of provisional patent application Ser. No. 61/551,587, filed Oct. 26, 2011, and provisional patent application Ser. No. 61/591,552, filed on Jan. 27, 2012, the disclosures of which are hereby incorporated herein by reference in their entirety.

FIELD OF THE DISCLOSURE

The disclosure relates to radio frequency (RF) switching converters and RF amplification devices that use RF switching converters.

BACKGROUND

More and more user communication devices are using radio frequency (RF) switching converters to convert a power source voltage (such as a battery voltage) into a supply voltage to power RF circuitry within the user communication device. This is because RF switching converters have a large power-handling capability, yet are more power efficient than other types of RF converters. For example, RF amplification devices in RF front end modules may use an RF switching converter to convert a power source voltage into a supply voltage provided to an RF amplification circuit that amplifies an RF signal.

If the RF switching converter provides Envelope Tracking (ET) and/or Average Power Tracking (APT), the supply voltage level of the supply voltage may need to be controlled with adequate precision in order to provide adequate power performance and to prevent unwanted distortion. Unfortunately, the RF switching converter may not always operate as designed due to manufacturing variations and operational variations. These manufacturing variations and operational variations can degrade power efficiency and cause distortion. Furthermore, ripple variations in the supply voltage level of the supply voltage may produce too much noise.

Accordingly, RF switching converters that are capable of correcting for the effects of manufacturing variations and operational variations are needed. In addition, RF switching converters that can reduce ripple variation in the supply voltage level of the supply voltage are needed.

SUMMARY

This disclosure relates generally to radio frequency (RF) switching converters and RF amplification devices that use RF switching converters. In one embodiment, an RF switching converter includes a switching circuit operable to receive a power source voltage and a switching controller operable to receive a target average frequency value that identifies a target average frequency. The switching circuit is switchable so as to generate a pulsed output voltage from the power source voltage. The switching controller is configured to switch the switching circuit such that the pulsed output voltage has an average pulse frequency.

Due to manufacturing variations and/or operational variations, the average pulse frequency of the pulsed output voltage may not be set appropriately. To correct the average pulse frequency, the switching controller is further configured to detect that the average pulse frequency of the pulsed output voltage during a time period differs from the target average frequency identified by the target average frequency value. In addition, the switching controller is configured to reduce a difference between the average pulse frequency and the target average frequency. In this manner, the effects of manufacturing variations and/or operational variations on the average pulse frequency can be eliminated, or at least diminished.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates one embodiment of a radio frequency (RF) switching converter with a switching controller and a switching circuit.

FIG. 2 illustrates one embodiment of an RF amplification device with another embodiment of an RF switching converter and an RF amplification circuit where the RF switching converter has the switching controller and the switching circuit shown in FIG. 1, along with an RF filter that converts a pulsed output voltage from the switching circuit into a supply voltage that is provided to the RF amplification circuit.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

This disclosure relates to radio frequency (RF) switching converters and RF amplification devices. RF switching converters convert a power source voltage, such as a battery voltage, into a supply voltage. Often, RF switching converters are employed in RF power amplification devices to provide the supply voltage to an RF amplification circuit within the RF amplification device. Using this supply voltage, the RF amplification circuit amplifies an RF signal by transferring power from the supply voltage to the RF signal in accordance with an amplifier gain.

The RF amplification devices may be used to amplify RF signals formatted in accordance with various RF communication standards. Different supply voltage biasing techniques may be more power efficient and/or introduce less distortion into the RF signal depending on the RF communication standard, power range, and/or RF frequency band. These supply voltage biasing techniques may include Envelope Tracking (ET), Average Power Tracking (APT), Polar Modulation, Low-Drop Out Regulation, and/or the like. Embodiments of the RF switching converters described herein may be designed to operate in different modes, where each mode is designed to implement a different supply voltage technique or a different set of supply voltage techniques. For example, in each mode, the RF switching converters may be designed to implement a different set of supply voltage techniques where each supply voltage technique in the set of supply voltage techniques provides a different supply voltage to different parts of the RF amplification circuit (such as driver amplifier stages and final amplifier stages).

Figure 1:
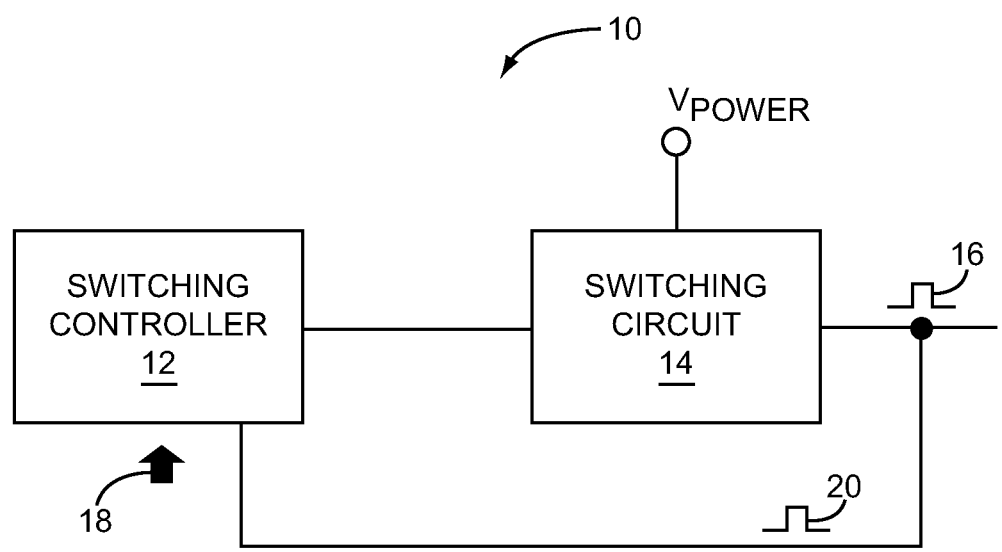

FIG. 1 is a block diagram of one embodiment of an RF switching converter 10. The RF switching converter 10 has a switching controller 12 and a switching circuit 14. The RF switching converter 10 is configured to generate a pulsed output voltage 16 from a power source voltage $V_{POWER}$. The power source voltage $V_{POWER}$ may come from a power source, such as a battery, an AC-to-DC converter, and/or the like. Except for power source abnormalities and possibly AC-to-DC ripple variations, the power source voltage level of the power source voltage $V_{POWER}$ may generally be described as DC and relatively constant, at least with respect to some acceptable ripple variation and/or some acceptable rate of transient voltage abnormalities. In particular, the switching circuit 14 is operable to receive the power source voltage $V_{POWER}$. The switching circuit 14 is switchable so as to generate the pulsed output voltage 16 from the power source voltage $V_{POWER}$. Thus, the switching circuit 14 may include one or more switches, such as switchable transistors, that can be turned on and turned off to present the pulsed output voltage 16 in at least two different voltage states. In this manner, pulses are produced in the pulsed output voltage 16.

The switching controller 12 is configured to switch the switching circuit 14 and determine switch timing for proper regulation of the pulsed output voltage 16. For example, the switching controller 12 may generate one or more control signals that turn on or turn off the switches and the switching circuit 14. The switching controller 12 may be analog, digital, and/or digital and analog, and may itself include various different controllers, as explained in further detail below. The pulsed output voltage 16 may be transmitted to an RF filter to convert the pulsed output voltage 16 into a supply voltage. The RF filter may or may not be included in the RF switching converter 10. For example, the RF filter may instead be included within a power amplification circuit and be external to the RF switching converter 10.

In this embodiment, the RF switching converter 10 may be used to employ APT and ET supply voltage biasing techniques. When RF signals are encoded using orthogonal frequency division multiple access multiplexing (OFDMA), the RF switching converter 10 may be used to implement ET. On the other hand, when RF signals are encoded using code division multiple access multiplexing (CDMA), the RF switching converter 10 may used to implement APT.

Referring again to FIG. 1, the switching controller 12 is configured to switch the switching circuit 14 such that the pulsed output voltage 16 has an average pulse frequency. In other words, although a duty ratio of the pulsed output voltage 16 may vary, the duty ratio has an average value with respect to time, and thus the pulsed output voltage 16 has an average pulse frequency with respect to time. A DC supply voltage level of the supply voltage is determined by a pulse frequency of the pulsed output voltage 16. Thus, a DC voltage state of the supply voltage varies as the pulse frequency varies.

By varying the pulse frequency and duty ratio of the pulsed output voltage 16, the DC voltage state of the supply voltage can change quickly. However, the pulsed output voltage has an average pulse frequency, which is essentially the mean frequency at which pulses are provided in the pulsed output voltage 16 with respect to time. Nevertheless, due to manufacturing variations and operational variations (such as temperature variation and power source variation), the average pulse frequency of the pulsed output voltage 16 may not always be set consistently or in accordance with a contemplated design. In fact, in some embodiments, the average pulse frequency has been shown to change by up to ±40% due to operational variations.

To mitigate the effects of manufacturing and operational variations, the switching controller 12 is configured to adjust the average pulse frequency. As shown in FIG. 1, the switching controller 12 is operable to receive a target average frequency value 18. In this embodiment, the target average frequency value 18 is a data parameter that identifies a target average frequency for the average pulse frequency of the pulsed output voltage 16. The switching controller 12 is configured to detect that the average pulse frequency of the pulsed output voltage 16 during a time period differs from the target average frequency identified by the target average frequency value 18. To help correct for the effects of manufacturing and/or operational variations on the average pulse frequency, the switching controller 12 reduces a difference between the average pulse frequency and the target average frequency identified by the target average frequency value 18. In this manner, the switching controller 12 can eliminate, minimize, or at least decrease errors in the average pulse frequency of the pulsed output voltage 16.

In the embodiment shown in FIG. 1, the switching controller 12 receives a pulsed feedback signal 20 that changes from one voltage state to another in accordance with the pulsed output voltage 16 generated by the switching circuit 14. Thus, the pulses of the pulsed feedback signal 20 are indicative of the pulses of the pulsed output voltage 16. From the pulsed feedback signal 20, the switching controller 12 can detect whether the average pulse frequency of the pulsed output voltage 16 differs from the target average frequency identified by the target average frequency value 18 during the time period. The switching controller 12 may then alter the switching frequency of the switching circuit 14 to reduce the difference between the average pulse frequency and the target average frequency identified by the target average frequency value 18.

It should be noted that the difference between the average pulse frequency and the target average frequency may or may not be eliminated after a single time period. For example, if the difference between the average pulse frequency and the target average frequency is large enough, the switching controller 12 may require multiple time periods in order to minimize the difference. Furthermore, the difference between the average pulse frequency and the target average frequency identified by the target average frequency value 18 may or may not ever be fully eliminated. This may depend on the frequency resolution and the control accuracy of a particular embodiment of the RF switching converter 10.

Figure 2:
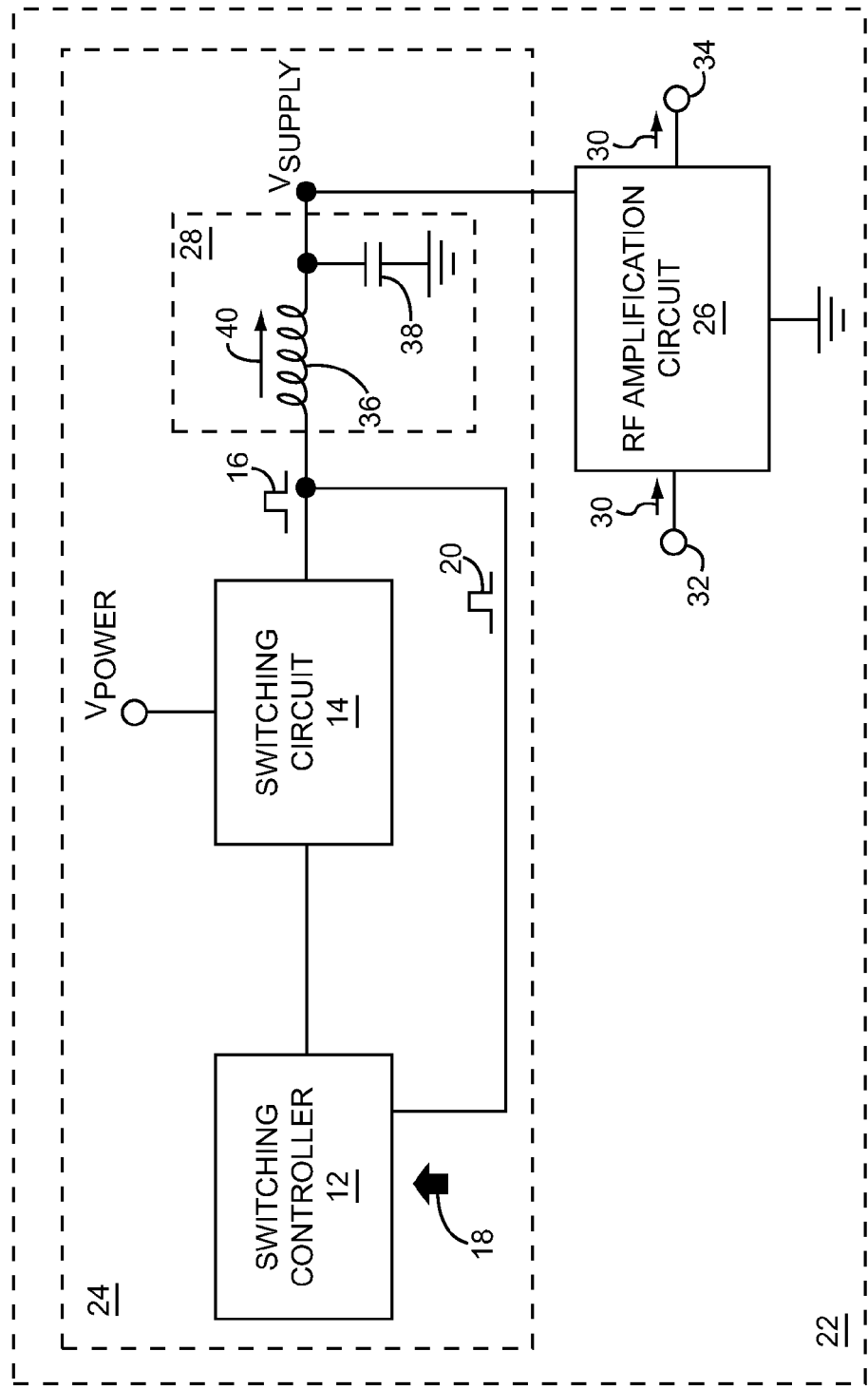

FIG. 2 illustrates one embodiment of an RF amplification device 22. The RF amplification device 22 includes another embodiment of an RF switching converter 24 and an RF amplification circuit 26. The RF switching converter 24 is the same as the RF switching converter 10 shown in FIG. 1, except the RF switching converter 24 shown in FIG. 2 has an RF filter 28 coupled to receive the pulsed output voltage 16. Thus, the RF switching converter 24 has the same switching controller 12 and the same switching circuit 14 described above with respect to FIG. 1. The RF filter 28 is configured to convert the pulsed output voltage 16 from the switching circuit 14 into a supply voltage $V_{SUPPLY}$ for the RF amplification circuit 26.

With regard to the RF amplification circuit 26 shown in FIG. 2, the RF amplification circuit 26 is operable to receive both the supply voltage $V_{SUPPLY}$ from the RF switching converter 24 and an RF signal 30 from external upstream RF circuitry. In this particular embodiment, the RF amplification circuit 26 receives the RF signal 30 at an input terminal 32. The RF amplification circuit 26 is configured to amplify the RF signal 30 using the supply voltage $V_{SUPPLY}$ from the RF switching converter 24. In other words, the RF amplification circuit 26 provides amplification to the RF signal 30 by transferring power from the supply voltage $V_{SUPPLY}$ to the RF signal 30. The RF amplification circuit 26 then outputs the RF signal 30 after amplification from an output terminal 34 to external downstream circuitry. For example, the RF amplification circuit 26 may be provided in a transmission chain of a transceiver in a user communication device, such as a laptop, a cellular phone, a tablet, a personal computer, or the like. The output terminal 34 may be coupled to an antenna (not shown) that radiates the RF signal 30 to a base station or directly to another user communication device after amplification by the RF amplification circuit 26.

The RF amplification circuit 26 may be configured to amplify the RF signal 30 when the RF signal 30 is formatted in accordance with any one of a multitude of RF communication standards. Often, the RF amplification circuit 26 is divided into RF amplification stages, including one or more driver RF amplification stages and a final RF amplification stage. The supply voltage $V_{SUPPLY}$ may provide the supply voltage $V_{SUPPLY}$ to all of the RF amplification stages, or alternatively, to a set of the RF amplification stages. For example, the supply voltage $V_{SUPPLY}$ may provide the supply voltage $V_{SUPPLY}$ to only the final RF amplification stage. Other circuitry may be provided in the RF switching converter 24 or externally to provide a second supply voltage to the driver RF amplification stages if desired.

The RF signal 30 may be encoded in any one of a plurality of multiplexing formats, such as Time Division Multiplexing (TDM), Frequency Division Multiplexing (FDM), CDMA, OFDMA, or the like. When CDMA is being employed, the RF switching converter 24 may be used to implement APT, and thus the RF amplification circuit 26 may need to be operated at back-off power levels well within a linear region of the RF amplification circuit 26. On the other hand, the RF switching converter 24 may be used to implement ET where the supply voltage level of the supply voltage $V_{SUPPLY}$ is modulated. Other types of power regulation circuits (either internal or external), such as linear drop-out regulators (LDOs), may be provided for TDM and FDM. However, LDOs are generally unable to efficiently transfer power to the RF amplification circuit 26 for CDMA and OFDMA due to large resistances, which consume a significant amount of power. The RF switching converter 24 is generally much more power efficient due to its ability to provide power conversion using primarily reactive components.

Referring again to FIG. 2, the switching controller 12 may be configured to switch the switching circuit 14 such that the RF amplification circuit 26 is configured to amplify the RF signal 30 when the RF signal 30 is formatted in accordance with a Long Term Evolution (LTE) standard, which utilizes OFDMA to encode data in the RF signal 30. The RF amplification circuit 26 needs to amplify the RF signal 30 without introducing an excessive amount of distortion into the RF signal 30. However, to do this at the maximum efficiency, the RF amplification circuit 26 should operate near saturation. If the saturation voltage simply remains constant, the RF amplification circuit 26 introduces an excessive amount of distortion to the RF signal 30, since the RF amplification circuit 26 is not operating linearly. Often, other approaches have dealt with this problem by backing off from the saturation point. However, in this embodiment, the supply voltage $V_{SUPPLY}$ has a supply voltage level that varies so as to adjust the saturation voltage of the RF amplification circuit 26. Thus, although the RF amplification circuit 26 does not operate linearly when saturated, the saturation voltage of the RF amplification circuit 26 is selected so that the amplification gain associated with that saturation voltage is maintained essentially constant given the input power of the RF signal 30. In this manner, amplification is provided linearly simply by selecting the saturation voltage so that the amplification gain remains essentially the same, regardless of the input power of the RF signal 30.

As shown in FIG. 2, the RF filter 28 is operable to receive the pulsed output voltage 16 from the switching circuit 14, and is configured to convert the pulsed output voltage 16 into the supply voltage $V_{SUPPLY}$. To convert the pulsed output voltage 16 into the supply voltage $V_{SUPPLY}$, the RF filter 28 includes a power inductor 36 coupled in series and a power capacitor 38 coupled in shunt with respect to the switching circuit 14. Accordingly, the power inductor 36 is configured to generate an inductor current 40 in response to the pulsed output voltage 16. While the voltage across the power inductor 36 can change instantly, the power inductor 36 resists changes in the inductor current 40. In contrast, while a current to the power capacitor 38 can change instantly, the power capacitor 38 resists changes in voltage. The supply voltage $V_{SUPPLY}$ in this embodiment is essentially the voltage across the power capacitor 38.

The power capacitor 38 generates the supply voltage $V_{SUPPLY}$ having a supply voltage level that varies in accordance with a ripple variation. However, this ripple variation is generally small, and the RF filter 28 generates the supply voltage $V_{SUPPLY}$ with an average DC supply voltage level set in accordance with a pulse frequency of the pulsed output voltage 16. Similarly, the power inductor 36 provides the inductor current 40 having an inductor current level that varies in accordance with a ripple variation. However, the ripple variation is generally small enough so that the inductor current 40 provides an average DC current level. As the pulse frequency varies, so does the average DC supply voltage level. In this manner, the supply voltage level is, for the most part, DC and can be set to a particular value by adjusting the pulse frequency of the pulsed output voltage 16.

The switching circuit 14 is operable to receive the power source voltage $V_{POWER}$, and is switchable so as to generate the pulsed output voltage 16 from the power source voltage $V_{POWER}$. The switching controller 12 is configured to switch the switching circuit 14 such that the pulsed output voltage 16 has an average pulse frequency. The average pulse frequency is generally a center value for the pulse frequency. In this embodiment, the average pulse frequency may be set to different values, such as, for example, 5 MHz, 18 MHz, or 30 MHz. The pulse frequency may vary from the average pulse frequency by ±4.5 MHz.

However, as discussed above, due to manufacturing variations and/or operational variations, the average pulse frequency (or, in other words, the center pulse frequency) may be set inappropriately or drift. To determine that the average pulse frequency is set incorrectly, the switching controller 12 receives the pulsed feedback signal 20 and detects whether the average pulse frequency of the pulsed output voltage 16 differs from the target average frequency identified by the target average frequency value 18 during the time period. If so, the switching controller 12 adjusts the average pulse frequency to reduce the difference between the average pulse frequency and the target average frequency identified by the target average frequency value 18.

Figure 3:
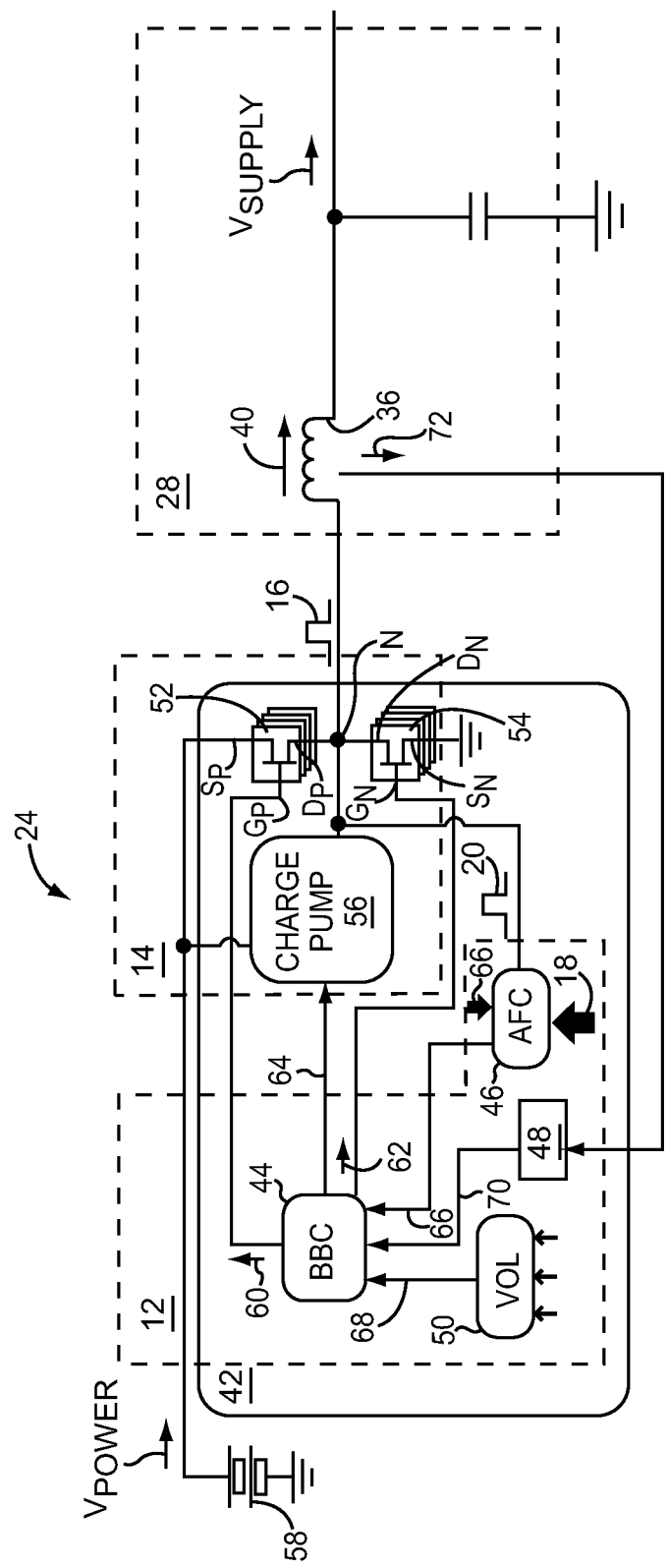
FIG. 3 is a semiconductor layout of one embodiment of the RF switching converter shown in FIG. 2, where the RF switching converter includes a bang-bang controller (BBC), a voltage offset loop (VOL), a current sense detector, and an average frequency controller (AFC).

FIG. 3 illustrates a semiconductor layout of one embodiment of the RF switching converter 24, with the switching controller 12, switching circuit 14, and RF filter 28 shown in FIG. 2. The RF switching converter 24 shown in FIG. 3 includes a semiconductor substrate 42. The switching controller 12 and the switching circuit 14 are formed with the semiconductor substrate 42. In particular, the switching controller 12 and the switching circuit 14 may be formed in a device region formed from metallic layers and doped semiconductor layers in the semiconductor substrate 42. Typical dopants that may be utilized to dope the semiconductor layers in the device region of the semiconductor substrate 42 are Gallium (Ga), Arsenic (As), Silicon (Si), Tellurium (Te), Zinc (Zn), Sulfur (S), Boron (B), Phosphorus (P), Beryllium (Be), Aluminum Gallium Arsenide (AlGaAs), Indium Gallium Arsenide (InGaAs), and/or the like. The device region is generally formed over a semiconductor die within the semiconductor substrate 42. The semiconductor die is generally not doped and can be formed from any suitable semiconductor material, such as Si, Silicon Germanium (SiGe), Gallium Arsenide (GaAs), Indium Phosphorus (InP), and/or the like.

The switching controller 12 shown in FIG. 3 includes a bang-bang controller (BBC) 44, an average frequency controller (AFC) 46, a current sense detector 48, and a voltage offset loop (VOL) 50. The switching circuit 14 includes a P-type field effect transistor (P-FET) 52, an N-type field effect transistor (N-FET) 54, and a charge pump 56. With regard to the switching circuit 14, the P-FET 52 is operable to receive the power source voltage $V_{POWER}$ from a power source 58, such as a battery. The N-FET 54 is operable to receive a reference voltage, such as ground. In this particular embodiment, the P-FET 52 includes a source $S_P$, a drain $D_P$, and a gate $G_P$. The source $S_P$ is configured to receive the power source voltage $V_{POWER}$. The N-FET 54 includes a drain $D_N$, a source $S_N$, and a gate $G_N$. The source $S_N$ is coupled to ground, while the drain $D_N$ is coupled directly to the drain $D_P$ of the P-FET 52. The pulsed output voltage 16 is generated from a node N between the drain $D_P$ and the drain $D_N$.

In order for the switching circuit 14 to generate the pulsed output voltage 16, the BBC 44 of the switching controller 12 is configured to switch the P-FET 52 between an on state and an off state. In the on state, the P-FET 52 is configured to pull the pulsed output voltage 16 toward the power source voltage $V_{POWER}$. The BBC 44 is also configured to switch the N-FET 54 between the on state and the off state. The N-FET 54 is configured to pull the pulsed output voltage 16 toward the reference voltage (i.e., ground) in the on state. To switch the P-FET 52 between the on state and the off state, the BBC 44 is operable to generate a first control signal 60 that may be provided in an activation state or in a deactivation state. The first control signal 60 is received at the gate $G_P$ of the P-FET 52. In the activation state, the first control signal 60 switches the P-FET 52 into the on state to pull the pulsed output voltage 16 toward the power source voltage $V_{POWER}$. When the first control signal 60 is in the deactivation state, the P-FET 52 is turned off and a power source voltage level of the power source voltage $V_{POWER}$ is dropped across the P-FET 52.

The BBC 44 also generates a second control signal 62. The gate $G_N$ of the N-FET 54 is operable to receive the second control signal 62 from the BBC 44. When the second control signal 62 is in an activation state, the N-FET 54 is switched on and the pulsed output voltage 16 is pulled toward the reference voltage, in this case ground. On the other hand, when the second control signal 62 is in the deactivation state, the N-FET 54 is switched off and the voltage from the node N to the reference voltage is dropped across the N-FET 54.

The BBC 44 is operable in a first bang-bang mode and in a second bang-bang mode. In the first bang-bang mode, the BBC 44 only switches the P-FET 52 and the N-FET 54 on and off. With regard to the first bang-bang mode, when the P-FET 52 is switched on, the N-FET 54 is switched off. Thus, the pulsed output voltage 16 is provided in a first voltage state near the power source voltage level of the power source voltage $V_{POWER}$. On the other hand, when the P-FET 52 is switched off, the N-FET 54 is switched on. Thus, the pulsed output voltage 16 is provided in a second voltage state near the reference voltage level of the reference voltage (in this case, ground).

With regard to the second bang-bang mode, the BBC 44 is also operable to control switches within the charge pump 56. The charge pump 56 has a switching topology that may include two flying capacitors and seven switches to allow the charge pump 56 to generate two different boost voltages that can be dynamically selected. Thus, while in the first bang-bang mode, the BBC 44 only switches the N-FET 54 and the P-FET 52 on and off to present step-down buck voltages at the node N. However, in the second bang-bang mode, the BBC 44 is further configured to operate the switches in the charge pump 56 so as to present two different boost voltages, equal to about 1.5 times the power source voltage $V_{POWER}$ and 2 times the power source voltage $V_{POWER}$ at node N. The BBC 44 may generate a charge pump output 64, which may include several control signals to control the switches of the charge pump 56. The operation of the BBC 44 is explained in further detail below.

To determine when to switch on and switch off the P-FET 52 and the N-FET 54 in either the first bang-bang mode or the second bang-bang mode, the BBC 44 receives a threshold parameter 66 from the AFC 46. The AFC 46 of the switching controller 12 is operable to receive the threshold parameter 66 at an initialized value from external circuitry. The BBC 44 is also operable to receive an offset voltage 68 from the VOL 50. Finally, the BBC 44 is operable to receive a current sense signal 70 from the current sense detector 48. The current sense signal 70 has a signal level indicative of a current level of the inductor current 40 of the power inductor 36. To do this, the current sense detector 48 receives a feedback voltage 72 and generates the current sense signal 70 as a current having a current level indicative of the current level of the inductor current 40.

The BBC 44 is configured to set the average pulse frequency of the pulsed output voltage 16 based on the threshold parameter 66 from the AFC 46. To correct the average pulse frequency, the AFC 46 adjusts the threshold parameter 66 to reduce the difference between the average pulse frequency and the target average frequency identified by the target average frequency value 18. After the time period for detection of the average pulse frequency, the AFC 46 adjusts the threshold parameter 66 and provides the updated threshold parameter 66 to the BBC 44.

Figure 4:
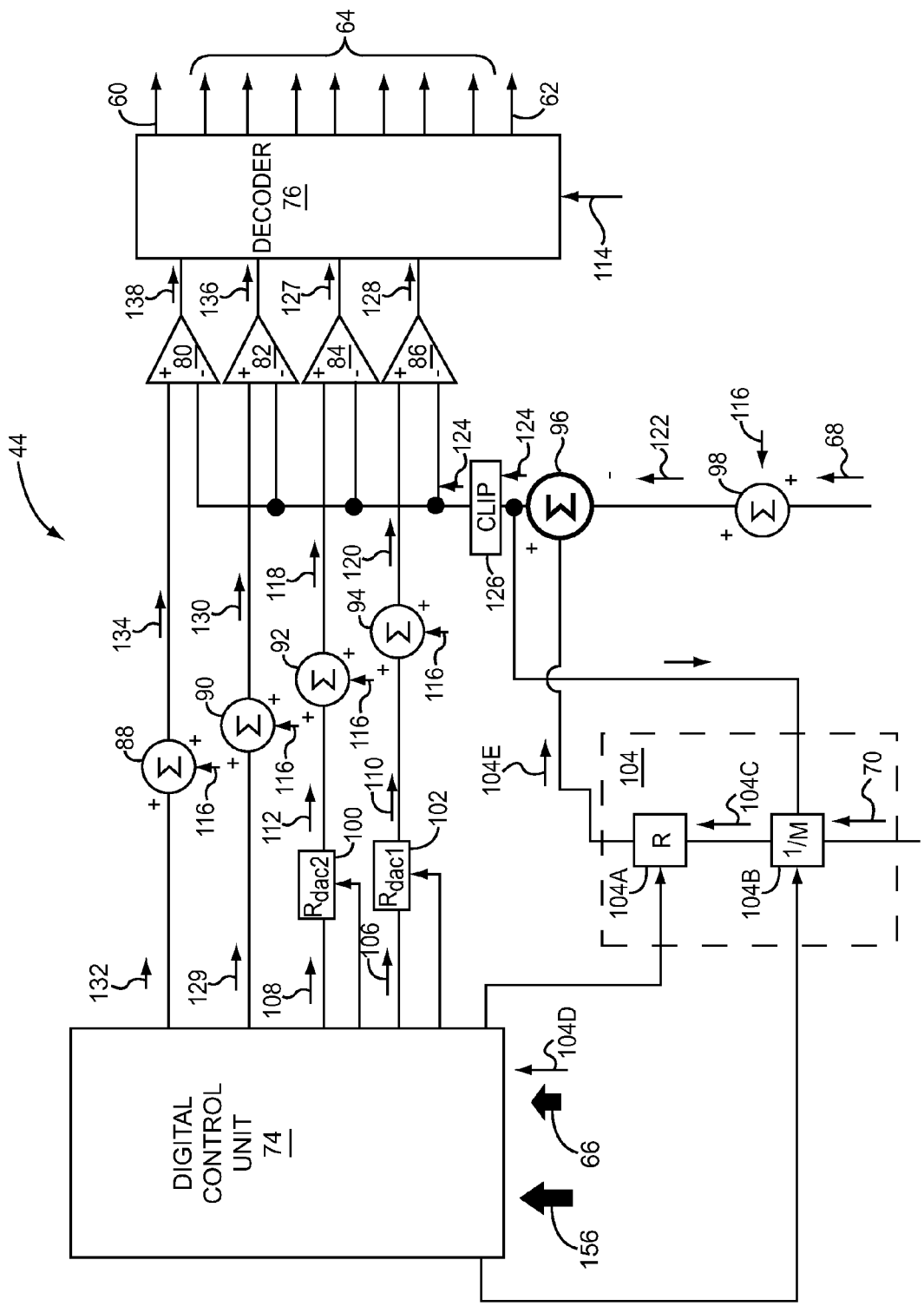
FIG. 4 illustrates one embodiment of the BBC shown in FIG. 3, which compares a sense signal level of a current sense signal to threshold voltage levels to operate the switching circuit shown in FIG. 3.

FIG. 4 illustrates one embodiment of the BBC 44 shown in FIG. 3. The BBC 44 includes a digital control unit 74, a decoder 76, a comparator 80, a comparator 82, a comparator 84, a comparator 86, a voltage adder 88, a voltage adder 90, a voltage adder 92, a voltage adder 94, a voltage adder 96, a voltage adder 98, a variable resistor 100, a variable resistor 102, and a mirrored ratio circuit 104. The digital control unit 74 is configured to receive the threshold parameter 66 from the AFC 46 (shown in FIG. 3). The BBC 44 is configured to set a first threshold signal level based on the threshold parameter 66. To do this, the digital control unit 74 searches a stored list of threshold magnitudes based on the threshold parameter 66. The threshold magnitude |TM| is then used to generate a first intermediary current signal 106 and a second intermediary current signal 108. The first intermediary current signal 106 has a current level with a negative of the threshold magnitude, −|TM|. The first intermediary current signal 106 is transmitted through the variable resistor 102 to provide a first intermediary voltage 110. In this embodiment, the first intermediary voltage 110 is a voltage across the variable resistor 102. The variable resistor 102 has a variable resistance of $R_{dac1}$, which is set by the digital control unit 74.

With regard to the second intermediary current signal 108, the second intermediary current signal 108 has a current level that is a positive of the threshold magnitude, +|TM|. The second intermediary current signal 108 is transmitted through the variable resistor 100 to generate a second intermediary voltage 112. In this embodiment, the second intermediary voltage 112 is a voltage across the variable resistor 100. The variable resistor 100 has a variable resistance of $R_{dac2}$. The digital control unit 74 is configured to set the variable resistance $R_{dac2}$. Generally, the variable resistances $R_{dac1}$, $R_{dac2}$ are set by the digital control unit 74 to the same, or substantially the same, resistance value.

With regard to the decoder 76, the decoder 76 is configured to receive an operational mode control signal 114. The operational mode control signal 114 may indicate either the first bang-bang mode or the second bang-bang mode. As shown in FIG. 4, the voltage adders 92 and 94 are provided in order to add a range voltage 116 to the first intermediary voltage 110 and the second intermediary voltage 112. In the first bang-bang mode, however, the range voltage 116 has a voltage level of zero (0) Volts. From the voltage adder 92, a first threshold signal 118 is generated having a first threshold signal level based on the threshold parameter 66. From the voltage adder 94, a second threshold signal 120 is generated having a second threshold signal level based on the threshold parameter 66.

The first threshold signal level and the second threshold signal level are used to determine when to turn on and turn off the P-FET 52 (shown in FIG. 3) and the N-FET 54 (shown in FIG. 3). In the first bang-bang mode, only the first threshold signal level of the first threshold signal 118 and the second threshold signal level of the second threshold signal 120 are relevant. The charge pump 56 (shown in FIG. 3) is not utilized. However, with regard to the second bang-bang mode, additional threshold levels to set boost levels can be provided through the operation of the charge pump 56.

In the embodiment shown in FIG. 4, both the first threshold signal 118 and the second threshold signal 120 are voltages, and in particular, DC voltages. Thus, the first threshold signal level of the first threshold signal 118 and the second threshold signal level of the second threshold signal 120 are relatively constant voltage levels. The second threshold signal level is lower than the first threshold signal level because the first intermediary current signal 106 had the negative of the threshold magnitude, −|TM|, while the second intermediary current signal 108 had the positive of the threshold magnitude, +|TM|. The first threshold signal 118 is received at a non-inverting terminal of the comparator 84, while the second threshold signal 120 is received at a non-inverting terminal of the comparator 86.

As shown in FIG. 4, the current sense signal 70 is received from the current sense detector 48. The current sense signal 70 is then provided to the mirrored ratio circuit 104. The mirrored ratio circuit 104 has a variable resistor 104A and a mirror circuit 104B. The mirror circuit 104B receives the current sense signal 70 and is configured to generate a mirror current 104C from the current sense signal 70. A ratio of a current level of the mirror current 104C and the current level of the current sense signal 70 is 1/M. The ratio 1/M is variable where the value of M is controlled by the digital control unit 74 based on a dedicated MIPI bit 104D.

The first threshold signal level and the second threshold signal level are set to equal the $R_{dac}$ (i.e., the resistance value of either $R_{dac1}$ or $R_{dac2}$)/R*M*|TM|. With regard to the first bang-bang mode, the value of M is set equal to 20. For instance, since the threshold parameter 66 is 4 bits, the threshold parameter 66 may represent current levels from 20 mA to 40 mA in steps of 2 mA. The second bang-bang mode requires an increased range. To increase the range for the second bang-bang mode, the value M is set equal to 40. For instance, since the threshold parameter 66 is 4 bits, the threshold parameter may represent current levels from 40 mA to 80 mA in steps of 4 mA. The threshold parameter 66 may thus represent current levels where the ratio of 1/M may be changed from 1/20 to 1/40 via the dedicated MIPI bit 104D.

A preliminary voltage 104E, which is the voltage across the variable resistor 104A, is then generated and provided to the voltage adder 96. The variable resistor 104A has a variable resistance R, which is set by the digital control unit 74. During operation of the VOL 50 (shown in FIG. 3) in fast mode, there is a need for a large dynamic range to control large current through an offset capacitor (discussed below), thus the variable resistances R, $R_{dac1}$, $R_{dac2}$ are reduced so that R and $R_{dac1}$, and R and $R_{dac2}$, have the same ratio to allow an increased feedback dynamic range, and the decoder 76 operates in the second bang-bang mode. Then, at the end of the fast mode, both the ratios for R and $R_{dac1}$, and R and $R_{dac2}$ are set back to their nominal values and the decoder 76 operates in the first bang-bang mode.

The offset voltage 68 is received at the voltage adder 98 from the VOL 50, which adds the range voltage 116 so as to generate a preliminary voltage 122. The preliminary voltage 122 is subtracted from the preliminary voltage 104E so as to generate a current sense signal 124 having a sense signal level indicative of a current level of the current across the power inductor 36 (shown in FIG. 3). In this case, the current sense signal 124 is a voltage and the sense signal level is a voltage level. As mentioned above, in the first bang-bang mode, only the first threshold signal level of the first threshold signal 118 and the second threshold signal level of the second threshold signal 120 are relevant. In this embodiment, the current sense signal 124 is a voltage, while the current sense signal 70 is a current. A clip 126 provides voltage limitations to the current sense signal 124 to ensure that the appropriate headroom is provided to the P-FET 52 (shown in FIG. 3) and the N-FET 54 (shown in FIG. 3).

The comparator 84 generates a comparator signal 127 from the comparison of the current sense signal 124 and the first threshold signal 118. The decoder 76 turns on the P-FET 52 and turns off the N-FET 54 in response to the sense signal level being above the first threshold signal level. As such, the decoder 76 is configured to generate the first control signal 60 in the activation state and the second control signal 62 in the deactivation state. The comparator 86 generates a comparator signal 128, which is received by the decoder 76. The comparator 86 is configured to compare the second threshold signal level and the sense signal level of the current sense signal 124. The decoder 76 is configured to turn off the P-FET 52 and turn on the N-FET 54 in response to the sense current signal level of the current sense signal 124 being below the second threshold signal level of the second threshold signal 120. Thus, in this case, the decoder 76 is configured to generate the first control signal 60 in the deactivation state and the second control signal 62 in the activation state. Note that the BBC 44 does not turn off the P-FET 52 and turn on the N-FET 54 when the sense signal level is below the first threshold signal level of the first threshold signal 118. Rather, the P-FET 52 is turned off and the N-FET 54 is turned on in response to the sense signal level being below the second threshold signal level. This provides the so-called "bang-bang" control operation of the BBC 44.

In the second bang-bang mode, the range voltage 116 is also provided to provide a greater range for comparisons. For example, the range voltage 116 may have a range voltage level of approximately 1.7 volts in the second bang-bang mode. A third intermediary voltage 129 is generated by the digital control unit 74 based on the threshold parameter 66. A third threshold signal 130 is generated from the voltage adder 90 having a third threshold signal level. In this manner, the BBC 44 is configured to set a third threshold signal level that is higher than the first threshold signal level in the high voltage mode. Additionally, the digital control unit 74 is configured to generate a fourth intermediary voltage 132 based on the threshold parameter 66 in the high voltage mode. A fourth threshold signal 134 is generated from the voltage adder 88 having a fourth threshold signal level. In this manner, the BBC 44 is configured to set a fourth threshold signal level that is higher than the third threshold signal level.

The comparator 82 receives the third threshold signal 130 at a non-inverting input and the current sense signal 124 at an inverting input. A comparator signal 136 is generated from the comparator 82. The decoder 76 is configured to switch the charge pump 56 (shown in FIG. 3) such that the pulsed output voltage 16 is provided in the first high voltage state (which, in this example, is approximately 1.5 times the power source voltage level of the power source voltage $V_{POWER}$) in response to the sense signal level being above the third threshold signal level of the third threshold signal 130. The comparator 80 is configured to receive the fourth threshold signal 134 at a non-inverting terminal and the current sense signal 124 at an inverting terminal. The comparator 80 is configured to generate a comparator signal 138. The decoder 76 is configured to switch the charge pump 56 such that the pulsed output voltage 16 is provided in the second high voltage state (which, in this example, is approximately double the power source voltage level of the power source voltage $V_{POWER}$) in response to the sense signal level being above the fourth threshold signal level. The decoder 76 is configured to control the charge pump 56 by controlling the activation and deactivation states of the control signals in the charge pump output 64.

Figure 5A:
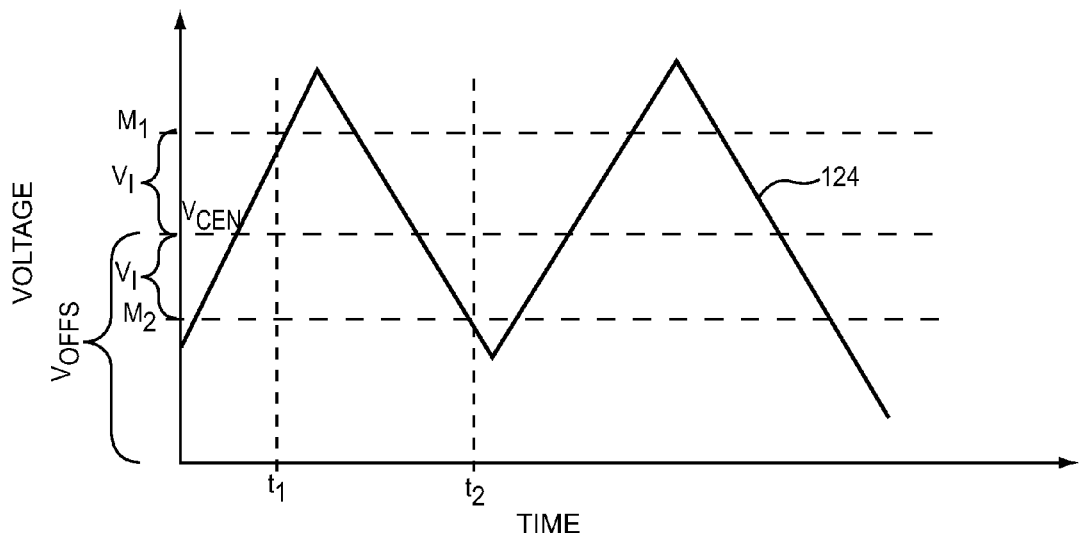
FIG. 5A illustrates one embodiment of the current sense signal as a function of time along with threshold voltage levels when the BBC shown in FIG. 4 is operating in a first bang-bang mode.
Figure 5B:
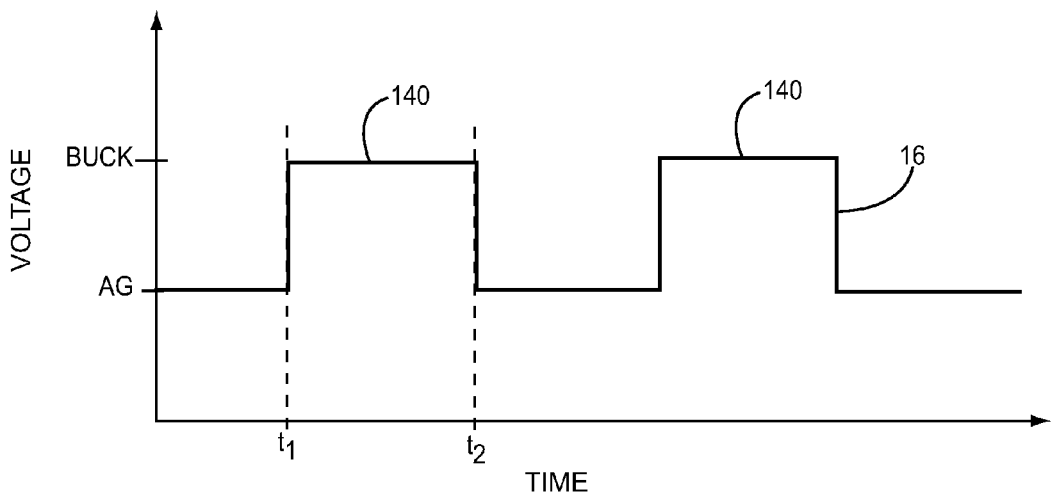
FIG. 5B illustrates one embodiment of the pulsed output voltage generated by the switching circuit shown in FIG. 3 when the BBC shown in FIG. 4 is operating in the first bang-bang mode.

Referring now to FIGS. 5A and 5B, FIG. 5A illustrates one embodiment of the current sense signal 124 with respect to time. The voltage magnitude $V_{OFFS}$ is the magnitude of the offset voltage 68 received from the VOL 50 shown in FIG. 3. Thus, in the first bang-bang mode, the magnitude $V_{OFFS}$ determines a center voltage level $V_{CEN}$ since the first intermediary current signal 106 was the negative of the threshold magnitude |TM|. Thus, the second threshold signal level is provided at a voltage difference $V_I$ lower than the center voltage level $V_{CEN}$. The second threshold voltage level is thus at $M_2$. Since the second intermediary current signal 108 had a current level that was the positive of the threshold magnitude |TM|, the first threshold voltage level of the first threshold signal 118 is provided at $M_1$. The first threshold voltage level $M_1$ is the voltage difference $V_I$ above the center voltage level $V_{CEN}$.

FIG. 5B illustrates one embodiment of the pulsed output voltage 16 in the first bang-bang mode. The voltage magnitude BUCK in FIG. 5B represents the voltage level resulting in the pulsed output voltage 16 when the P-FET 52 (shown in FIG. 3) is pulled up near the power source voltage level of the power source voltage $V_{POWER}$ (shown in FIG. 3). The voltage magnitude AG (i.e., approximately ground) in FIG. 5B represents the voltage level resulting in the pulsed output voltage 16 when the N-FET 54 (shown in FIG. 3) is pulled down near ground. As shown in FIG. 5A, the sense signal level of the current sense signal 124 is above the first threshold voltage level $M_1$ at time $t_1$. Accordingly, the P-FET 52 pulls the pulsed output voltage 16 to the voltage level BUCK in response to the sense signal level of the current sense signal 124 being above the first threshold voltage level $M_1$, as shown in FIG. 5B. The pulsed output voltage 16 is maintained at the voltage level BUCK until time $t_2$. As shown in FIG. 5A, the sense signal level of the current sense signal 124 is below the second threshold voltage level $M_2$ at time $t_2$. Accordingly, the N-FET 54 pulls the pulsed output voltage 16 to the voltage level AG in response to the sense signal level of the current sense signal 124 being below the first threshold voltage level $M_2$, as shown in FIG. 5B. The process repeats itself to generate pulses 140 in the pulsed output voltage 16. The BBC 44 shown in FIG. 3 is thus configured to switch the switching circuit 14 at a switching frequency that is based on the threshold parameter 66. This is because the threshold parameter 66 determines the voltage and the voltage difference $V_T$, and thus determines how often and for how long a pulse 140 is provided in the pulsed output voltage 16.

Figure 6A:
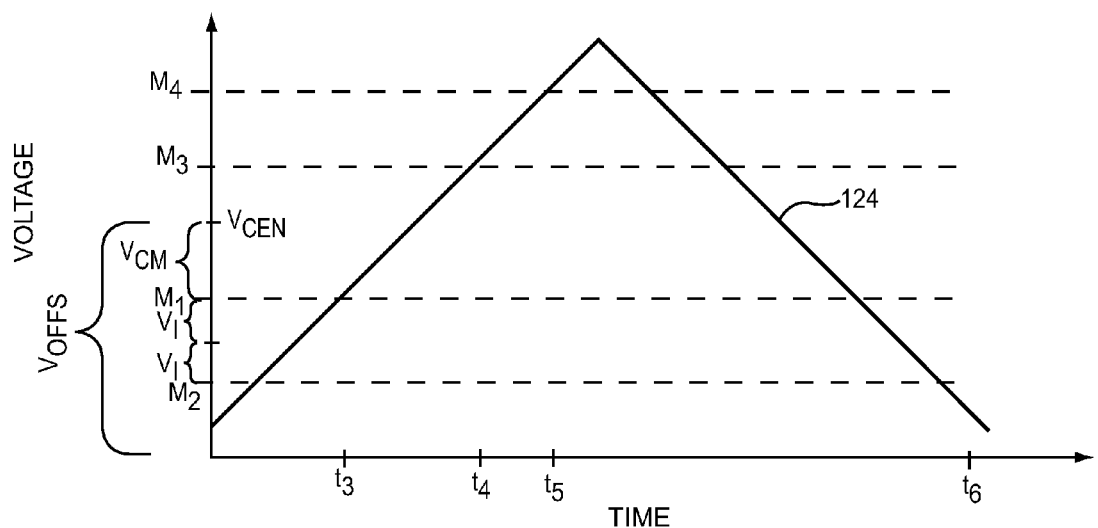
FIG. 6A illustrates one embodiment of the current sense signal as a function of time along with threshold voltage levels when the BBC is operating in a second bang-bang mode.
Figure 6B:
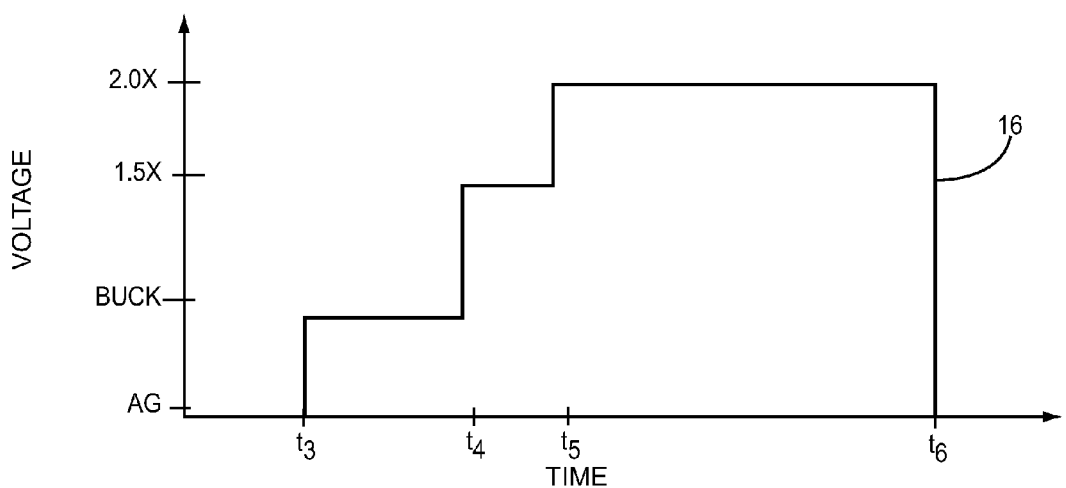
FIG. 6B illustrates one embodiment of the pulsed output voltage generated by the switching circuit shown in FIG. 3 when the BBC shown in FIG. 4 is operating in the second bang-bang mode.

FIG. 6A and FIG. 6B illustrate the operation of the BBC 44 shown in FIG. 3 in the second bang-bang mode. Note that in the second bang-bang mode, the first threshold signal level $M_1$ and the second threshold signal level $M_2$ have been adjusted downward by the range voltage level $V_{CM}$ of the range voltage 116 (shown in FIG. 4). The current sense signal 124 is shown in FIG. 6A, along with the third threshold signal level $M_3$ of the third threshold signal 130 and the fourth threshold signal level $m_4$ of the fourth threshold signal 134.

At time $t_3$, the sense signal level of the current sense signal 124 is above the first threshold signal level $M_1$, as shown in FIG. 6A. Accordingly, in response, the pulsed output voltage 16 is pulled to the voltage level BUCK, as shown in FIG. 6B. The voltage level of the pulsed output voltage 16 is maintained at the voltage level BUCK until time $t_4$. At time $t_4$, the sense signal level of the current sense signal 124 is above the third threshold signal level $M_3$, as shown in FIG. 6A. Accordingly, the BBC 44 switches the charge for the charge pump 56 so that the voltage level of the pulsed output voltage 16 is provided at the high voltage state of 1.5×, as shown in FIG. 6B. The voltage level is maintained in the high voltage state 1.5× until time $t_5$. At time $t_5$, the sense signal level of the current sense signal 124 is above the fourth threshold signal level $M_4$, as shown in FIG. 6A. Accordingly, in response, the BBC 44 operates the charge pump 56 so that the voltage level of the pulsed output voltage 16 is provided at the high voltage state 2.0×, as shown in FIG. 6B. The voltage level of the pulsed output voltage 16 is maintained at the high voltage state 2.0× until time $t_6$. At time $t_6$, the sense signal level of the current sense signal 124 is below the second threshold signal level $m_2$, as shown in FIG. 6A. Accordingly, in response, the voltage level of the pulsed output voltage 16 is pulled down to the voltage level AG, as shown in FIG. 6B. Given that an example of the operation of the BBC 44 (shown in FIG. 3) in FIGS. 5A, 5B, 6A, and 6B has been given, the operation of embodiments of the AFC 46 (shown in FIG. 3) can now be described.

Figure 7:
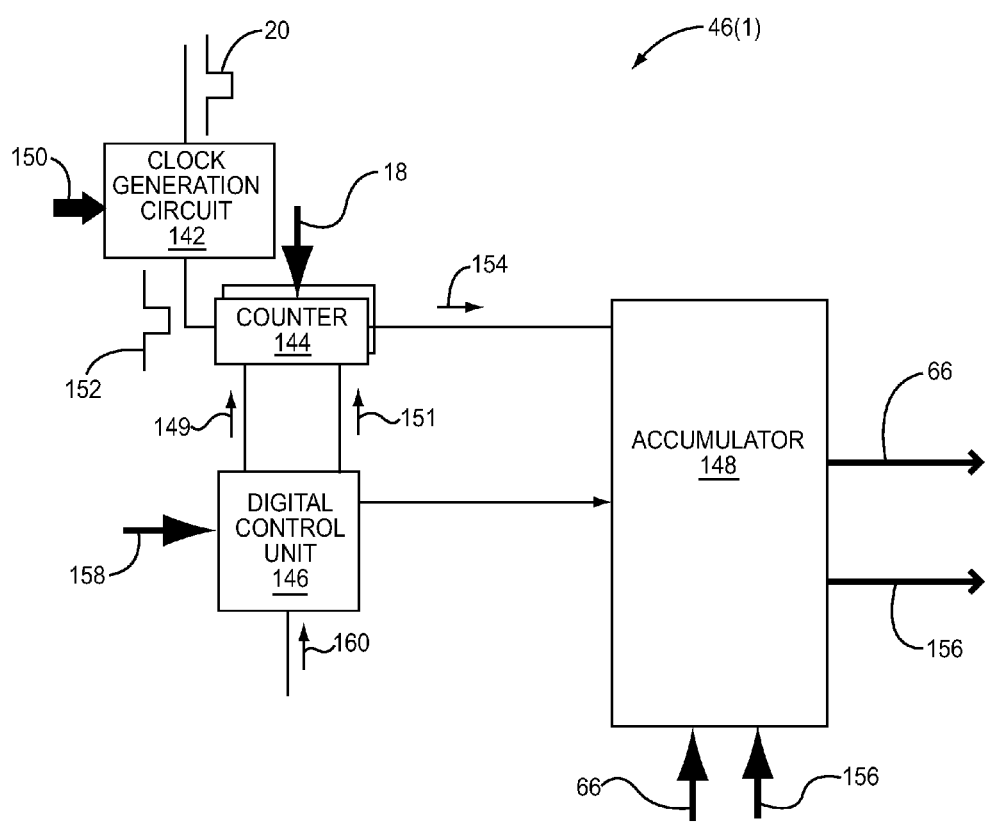
FIG. 7 illustrates one embodiment of the AFC shown in FIG. 3, wherein the AFC sets a pulse count integer to an initial value and decrements the pulse count integer to a final value to determine whether an average pulse frequency of the pulsed output voltage is greater than or less than a target average frequency.

FIG. 7 illustrates one embodiment of an AFC 46(1). The AFC 46(1) includes a clock generation circuit 142, a counter 144, a digital control unit 146, and an accumulator 148. In this embodiment, the clock generation circuit 142 receives a pulse ratio parameter 150 that identifies a pulse ratio. For example, the pulse ratio parameter 150 may be an integer equal to one (1), two (2), or four (4). The clock generation circuit 142 generates a clock signal from the pulsed feedback signal 20. More specifically, the clock generation circuit 142 shown in FIG. 7 is configured to generate a clock signal 152 such that clock pulses of the clock signal 152 are provided at the pulse ratio with respect to the pulses 140 (shown in FIG. 5B) of the pulsed output voltage 16 (shown in FIGS. 3 and 5B). Thus, if the pulse ratio identified by the pulse ratio parameter 150 is one (1), for every pulse in the pulsed feedback signal 20 there is a clock pulse in the clock signal 152. In contrast, if the pulse ratio parameter 150 is two (2), the clock generation circuit 142 provides one clock pulse for every two pulses in the pulsed feedback signal 20. If the pulse ratio identified by the pulse ratio parameter 150 is four (4), there will be four pulses in the pulsed feedback signal 20 for every clock pulse in the clock signal 152.

The clock generation circuit 142 provides the clock signal 152 to the counter 144. The counter 144 is configured to perform a count operation on a pulse count integer during a time period in accordance with the clock signal 152 so that the pulse count integer has a final value upon expiration of the time period. To initiate the pulse count integer of the counter 144 to an initial value, the digital control unit 146 is configured to generate an enable signal 149 and a reset signal 151. In other words, upon receiving both the enable signal 149 and the reset signal 151, the counter 144 is configured to set the pulse count integer to the initial value. In this embodiment, the value of the pulse count integer is initialized to equal the number of clock pulses of the clock signal 152 that should be provided if the pulsed output voltage 16 is operating at the target average frequency identified by the target average frequency value 18. The initial value of the pulse count integer is thus equal to the target average frequency identified by the target average frequency value 18, multiplied by a time duration of the time period, and divided by a pulse ratio of the pulse ratio parameter 150.

In this embodiment, the count operation performed by the counter 144 is a decrement operation that decrements the pulse count integer as long as the pulse count integer is above a minimum value. For example, the count operation decrements the pulse count integer until the pulse count integer reaches a minimum value, which in this example is zero (0). The final value of the pulse count integer is thus indicative of when the average pulse frequency during the time frequency differs from the target average frequency identified by the target average frequency value 18. If the final value of the pulse count integer is zero (0), it may be presumed that the average pulse frequency is greater than the target average frequency. If the final value is greater than zero (0), it may be presumed that the average pulse frequency is less than the target average frequency.

The counter 144 then sets a flag bit 154 based on the final value of the pulse count integer. In this embodiment, the counter 144 sets the flag bit 154 to a first bit state in response to the final value of the pulse count integer being above the minimum value, which in this example is zero (0). The counter 144 sets the flag bit 154 to a second bit state antipodal to the first bit state in response to the final value of the pulse count trigger being equal to the minimum value. For example, the flag bit 154 may be set to a logical 1 if the final value of the pulse count integer is greater than the minimum value (i.e., zero (0) in this example). The counter 144 would set the flag bit 154 to a logical 0 if the final value of the pulse count integer is at the minimum value (i.e., zero (0) in this example).

The accumulator 148 is operable to receive the threshold parameter 66 and the flag bit 154. The accumulator 148 is configured to adjust the threshold parameter 66 such that the threshold parameter 66 is increased by a step size in response to the flag bit 154 being in the first bit state (i.e., in this example, logical 1). As a result, this reduces the average pulse frequency. In contrast, the accumulator 148 is configured to adjust the threshold parameter 66 such that the threshold parameter 66 is decreased by the step size in response to the flag bit 154 being in the second bit state (i.e., in this example, logical 0). As a result, the threshold parameter 66 is provided to the BBC 44 such that the BBC 44 increases the average pulse frequency of the pulsed output voltage 16.

Note that the accumulator 148 is further operable to receive a noise adjustment selection bit 156. The accumulator 148 is configured to set the step size to a first integer in response to the noise adjustment selection bit 156 being in the first bit state (i.e., logical 1) and is configured to set the step size to a second integer in response to the noise adjustment selection bit 156 being in the second bit state (i.e., logical 0). In this embodiment, the first integer is a step size of two (2), while the second integer is a step size of one (1). The noise adjustment selection bit 156 is provided to the BBC 44 shown in FIG. 3. The digital control unit 74 shown in FIG. 4 is configured to set the ratio between the variable resistors 100, 102, 104A and the value of M in accordance with the noise adjustment selection bit 156. For example, if the noise adjustment selection bit 156 is equal to zero (0), the first bang-bang mode is selected. M is equal to the value 20 and the ratios between the variable resistor 104A and the variable resistor 102, and between the variable resistor 104A and the variable resistor 100, are set accordingly. On the other hand, if the noise adjustment selection bit 156 is equal to one (1), the second bang-bang mode is selected. M is equal to 40 and the ratios between the variable resistor 104A and the variable resistor 102, and between the variable resistor 104A and the variable resistor 100, are set accordingly by the digital control unit 74.

Also, note that the digital control unit 146 shown in FIG. 7 is configured to receive a mode value 158. If the mode value 158 is equal to zero (0), the accumulator 148 only loads the threshold parameter 66 and the noise adjustment selection bit 156. When the mode value 158 is equal to one (1), the accumulator 148 updates the threshold parameter 66 after the time duration. If the mode value 158 is equal to two (2), the accumulator 148 holds the threshold parameter 66 without providing any changes.

To start the time period, the digital control unit 146 is configured to receive a trigger signal 160. The trigger signal 160 may be in an activation state or in a deactivation state. In this particular embodiment, the trigger signal 160 is a time slot initiation signal. The digital control unit 146 is configured to begin the time period in response to the trigger signal 160 being in the activation state. This signifies the beginning of the time slot.

When the mode value 158 is equal to one (1), the digital control unit 146 sets the pulse count integer to the initial value and performs a count operation in response to each one of the clock pulses of the clock signal 152. If the pulse ratio parameter 150 is equal to one (1), this means that the digital control unit 146 sets the time duration of the time period to approximately a first time slot size in response to the pulse ratio parameter being 1. For example, the first time slot size may be equal to 0.5 milliseconds. The digital control unit 146 may also set the time duration to equal a second time slot size greater than the first time slot size in response to the pulse ratio parameter 150 being equal to two (2). For example, the second time slot size may be 0.667 milliseconds. The digital control unit 146 sets the time duration of the time period to approximately double the second time slot size in response to the pulse ratio parameter 150 being equal to four (4). Thus, in this example, the time duration will cover two time slots of 0.667 milliseconds. Between the time slots, the mode value 158 may be provided as two (2) in order for the accumulator 148 to hold its contents. After the time duration, whether 0.5 milliseconds, 0.667 milliseconds, or 2×0.667 milliseconds, the accumulator 148 adjusts the threshold parameter 66, and the updated threshold parameter 66 is provided for the next subsequent time slot.

Figure 8A:
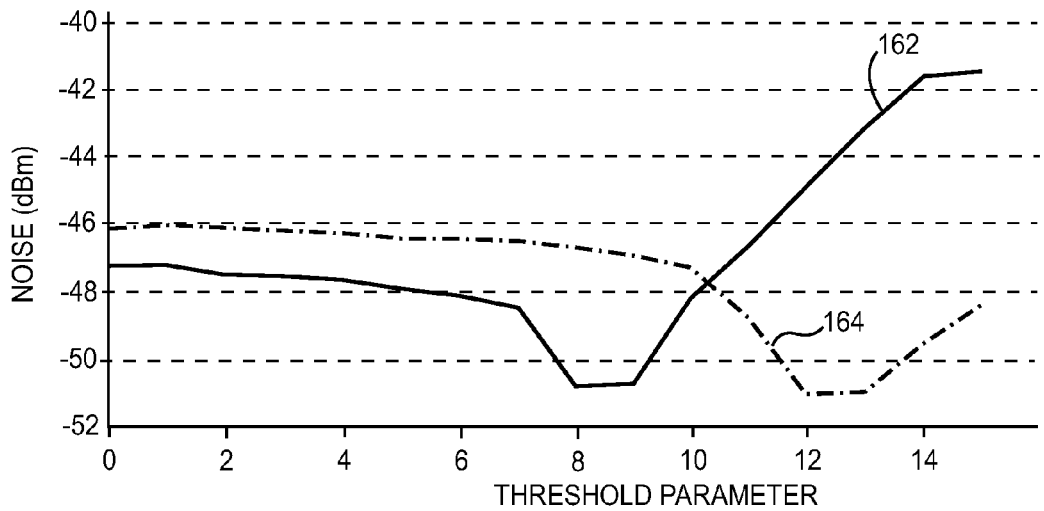
FIG. 8A illustrates a pair of noise curves for the RF switching converter shown in FIG. 3, wherein the noise curves are each shown as a function of a threshold parameter when the target average frequency is 30 MHz.
Figure 8B:
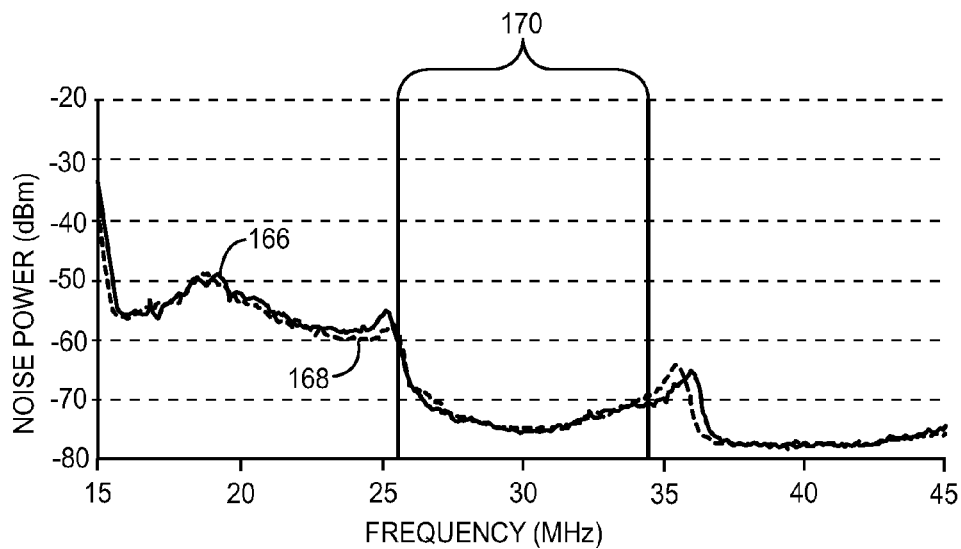
FIG. 8B illustrates a pair of wideband noise power curves for the RF switching converter shown in FIG. 3, wherein the wideband noise power curves are functions of frequency.

Referring now to FIGS. 8A and 8B, FIG. 8A has a noise curve 162 and a noise curve 164 as functions of the threshold parameter 66 when the target average frequency is 30 MHz. In particular, the noise curve 162 is provided when the noise adjustment selection bit 156 is equal to zero (0), while the noise curve 164 is provided when the noise adjustment selection bit 156 is equal to one (1).

FIG. 8B illustrates a first wideband noise power curve 166 and a second wideband noise power curve 168 as functions of frequency. Also shown is a transmission band 170 having a center frequency of 30 MHz and cut-off frequencies of around 30 MHz±4.5 MHz. The first wideband noise power curve 166 is provided when the noise adjustment selection bit 156 is equal to zero (0), and the second wideband noise power curve 168 is provided when the noise adjustment selection bit 156 is equal to one (1).

Figure 9:
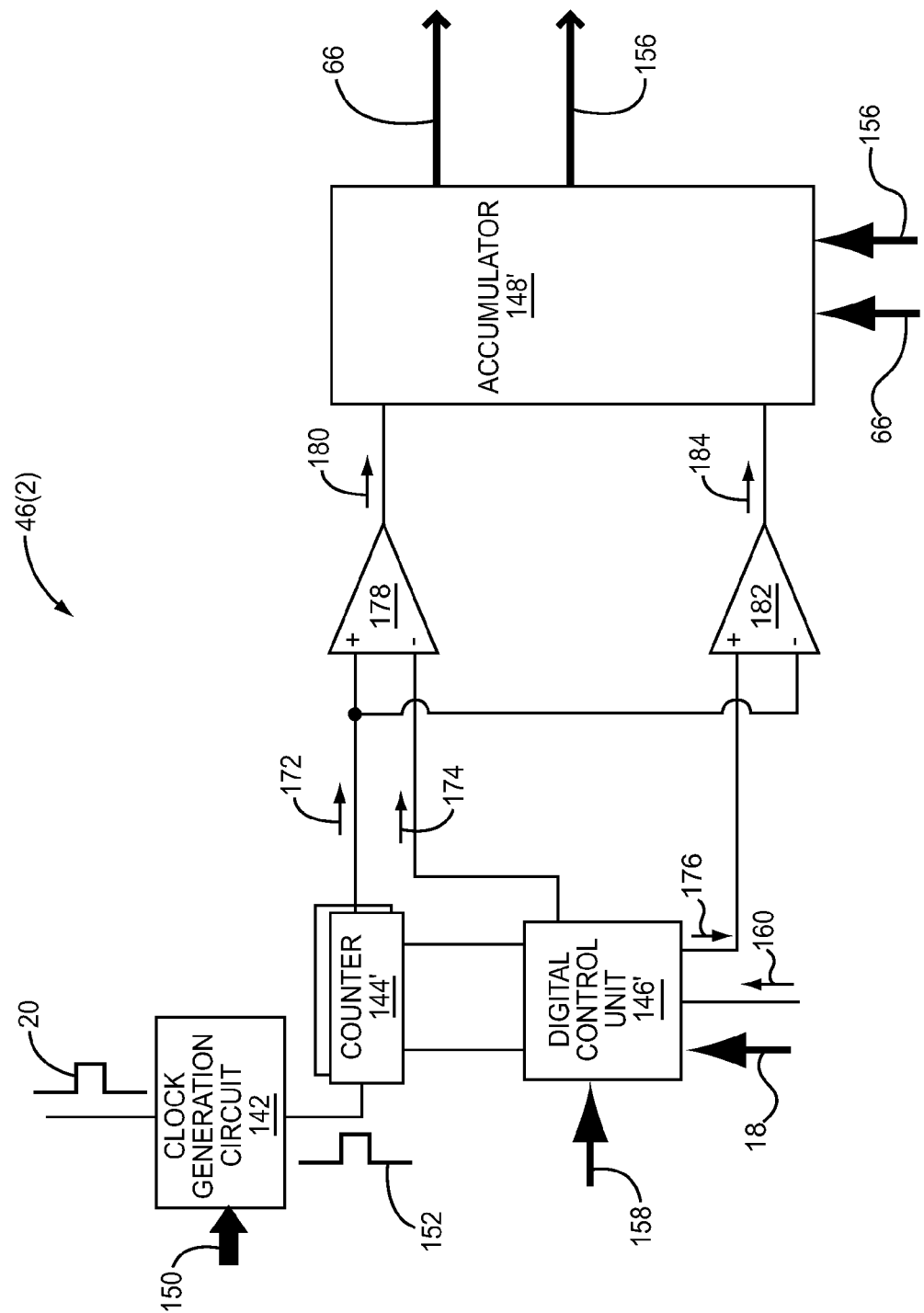
FIG. 9 illustrates another embodiment of the AFC shown in FIG. 3, wherein the AFC sets a pulse count integer to an initial value and increments the pulse count integer to a final value, and upper limits and lower limits for the final value are calculated to determine whether the average pulse frequency of the pulsed output voltage should be adjusted.

FIG. 9 illustrates another embodiment of an AFC 46(2). The AFC 46(2) is similar to the AFC 46(1) shown in FIG. 7. However, the count operation performed by a counter 144' is an increment operation that increments the pulse count integer. Thus, in this embodiment, the pulse count integer may be set to an initial value of zero (0). A digital control unit 146' is operable to receive the target average frequency value 18. In this embodiment, the digital control unit 146' is configured to calculate an upper limit for the final value of the pulse count integer based on the target average frequency value 18 and the pulse ratio parameter 150. Accordingly, given a tolerance, the digital control unit 146' calculates the upper limit for the final value. The digital control unit 146' is also configured to calculate a lower limit for the final value based on the target average frequency value 18 and the pulse ratio parameter 150. Given the tolerance, the final value for the pulse count integer should not be lower than a particular value. The clock generation circuit 142 generates the clock signal 152 such that the clock pulses of the clock signal 152 have the pulse ratio identified by the pulse ratio parameter 150 with respect to the pulses of the pulsed output voltage 16. The counter 144' performs the count operation on the pulse count integer, in this example, an increment operation, in response to each one of the clock pulses. Thus, in response to each clock pulse, the counter 144' is configured to increment the pulse count integer.

After the time period is over, the counter 144' is configured to generate a pulse count integer voltage 172 having a voltage level indicative of the final value. The digital control unit 146' is configured to generate an upper limit voltage 174 having a voltage level indicative of the upper limit for the final value. Additionally, the digital control unit 146' is configured to generate a lower limit voltage 176 having a voltage level indicative of the lower limit for the final value. The AFC 46(2) has a first comparator 178 configured to compare the upper limit voltage 174 and the pulse count integer voltage 172 so as to generate a first comparator signal 180. The first comparator signal 180 is in an activation state in response to the voltage level of the pulse count integer voltage 172 being greater than the voltage level of the upper limit voltage 174. The AFC 46(2) also includes a second comparator 182 configured to compare the lower limit voltage 176 and the pulse count integer voltage 172 so as to generate a second comparator signal 184. The second comparator signal 184 is in an activation state in response to the voltage level of the pulse count integer voltage 172 being lower than the voltage level of the lower limit voltage 176.

The accumulator 148' is configured to receive the threshold parameter 66, the first comparator signal 180, and the second comparator signal 184. If the first comparator signal 180 is in the activation state and the second comparator signal 184 is in the deactivation state, the accumulator 148' is configured to adjust the threshold parameter 66 by increasing the threshold parameter 66 by a step size in response to the first comparator signal 180 being in the activation state. If the second comparator signal 184 is in the activation state and the first comparator signal 180 is in the deactivation state, the accumulator 148' is configured to adjust the threshold parameter 66 by decreasing the threshold parameter 66 by a step size in response to the second comparator signal 184 being in the activation state. As in the previous embodiment described above with regard to FIG. 7, the noise adjustment selection bit 156 may be used to select an integer size of the step size.

Figure 10:
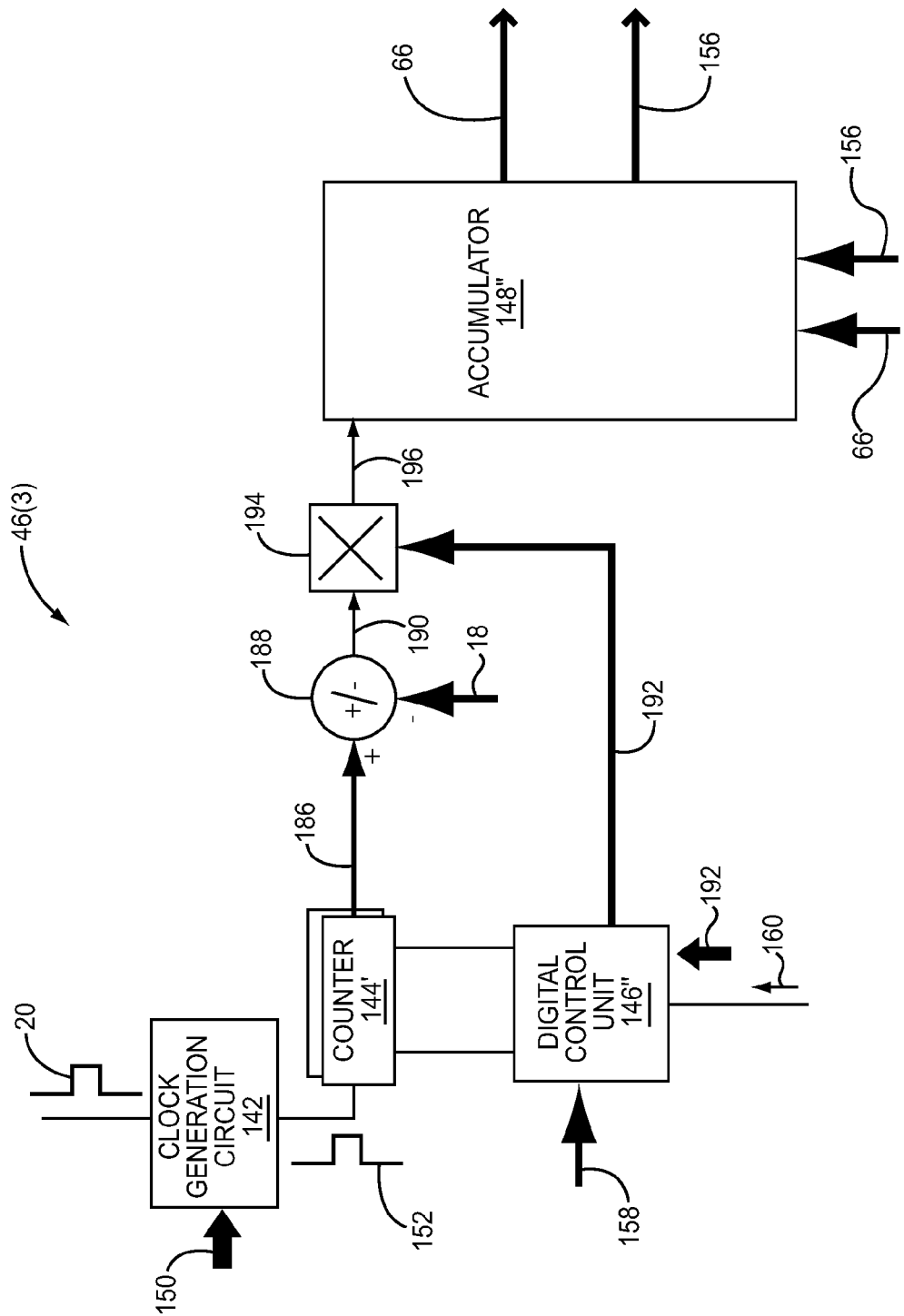
FIG. 10 illustrates still another embodiment of the AFC shown in FIG. 3, wherein the AFC sets a pulse count integer to an initial value and increments the pulse count integer to a final value, and a gain error is used to adjust the average pulse frequency.

FIG. 10 illustrates another embodiment of an AFC 46(3). The AFC 46(3) includes the same counter 144' described above with regard to FIG. 9. As such, the counter 144' increments the pulse count trigger from an initial value in response to each of the clock pulses of the clock signal 152. However, in this embodiment of the AFC 46(3), the counter 144' outputs a pulse count integer 186 at the final value. The AFC 46(3) includes a subtractor 188 operable to receive the pulse count integer 186 at the final value. The subtractor 188 is configured to subtract the target average frequency value 18 from the final value of the pulse count integer 186 so as to generate a count error value 190.

In this embodiment, a digital control unit 146" is operable to receive a gain error parameter 192 that identifies a gain error. The digital control unit 146" provides the gain error parameter 192 to a multiplier 194. The multiplier 194 also receives the count error value 190 from the subtractor 188. The gain error parameter 192 identifies the gain error, which indicates a ratio of adjustment for the threshold parameter 66 with respect to the count error value 190. The multiplier 194 is configured to multiply the gain error parameter 192 with the count error value 190 so as to generate an error value 196.

An accumulator 148" is operable to receive the error value 196 from the multiplier 194. The accumulator 148" is configured to adjust the threshold parameter 66 by adding the error value 196 or a rounded value of the error value 196 to the threshold parameter 66. After updating the threshold parameter 66, the accumulator 148" provides the threshold parameter 66 to the BBC 44 (shown in FIG. 3), as described above.

The switching controller 12 shown in FIG. 3 is further configured to reduce the ripple variation in the supply voltage level of the supply voltage $V_{SUPPLY}$. One way of reducing the ripple variation is to increase the inductance of the power inductor 36. However, this would be detrimental to the operation of the RF switching converter 24 due to the large slew rate since the maximum current rate that the switching circuit 14 can deliver efficiently is limited by $(V_{POWER}-BUCK)/L_{POWER\ INDUCTOR}=dI_{POWER\ INDUCTOR}/dt$.

Figure 11:
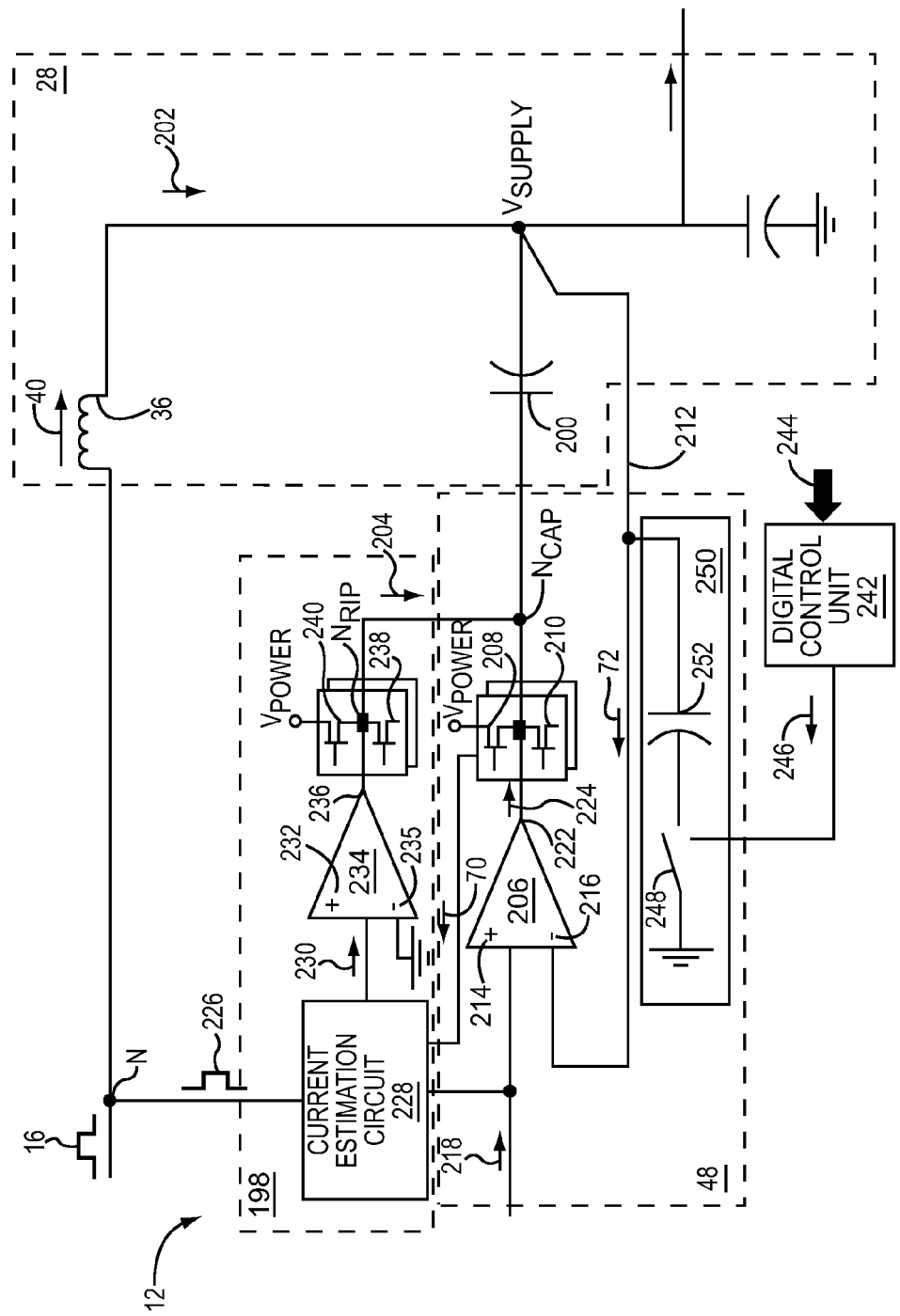
FIG. 11 illustrates one embodiment of the current sense detector shown in FIG. 3, along with a ripple correction circuit configured to generate a ripple correction current that reduces ripple variation in a supply current level of a supply current provided by the RF switching converter shown in FIG. 3.

FIG. 11 illustrates one embodiment of the current sense detector 48 shown in FIG. 3, along with a ripple current correction circuit 198 used to decrease the ripple variation in the $V_{SUPPLY}$ without requiring an increase of the inductance of the power inductor 36. In this embodiment, the switching controller 12 includes the current sense detector 48 and the ripple current correction circuit 198. However, it should be noted that in alternative embodiments, the current sense detector 48 and the ripple current correction circuit 198 may be provided in circuitry outside or external to the switching controller 12.

Referring again to FIG. 11, the RF filter 28 has a decoupling capacitor 200 coupled to receive the supply voltage $V_{SUPPLY}$. The current sense detector 48 is configured to generate the current sense signal 70 having the sense signal level set so as to indicate a supply current level of a supply current 202 resulting from the supply voltage $V_{SUPPLY}$. In this embodiment, the supply current 202 is the inductor current 40. The ripple current correction circuit 198 is configured to receive the current sense signal 70 from the current sense detector 48 and generate a ripple correction current 204. In this manner, ripple variation in the supply current level of the supply current 202 can be corrected without having to significantly increase the inductance of the power inductor 36.

For instance, the RF amplification circuit 26 (shown in FIG. 2) has a non-zero and varying output impedance. Due to this non-linear output impedance, the ripple variation of both the supply current 202 and the supply voltage $V_{SUPPLY}$ can be significantly high without correction. In order to reduce the ripple variation of the supply current 202 (and therefore also reduce the ripple variation of the supply voltage $V_{SUPPLY}$), the current sense detector 48 is configured to adjust the sense signal level of the current sense signal 70 in response to a change in the supply voltage level of the supply voltage $V_{SUPPLY}$ at the decoupling capacitor 200. Accordingly, the sense signal level of the current sense signal 70 is adjusted such that the sense signal level varies in accordance with the ripple variation of the supply voltage $V_{SUPPLY}$, and thus as a result of the ripple variation of the supply current level of the supply current 202. In other words, the rippling supply voltage results in the ripple variation in the supply current level of the supply current 202, thereby resulting in rippling across the decoupling capacitor 200. Accordingly, the sense signal level of the current sense signal 70 ripples in accordance with the ripple variation and the supply current level of the supply current 202.

As shown in FIG. 11, the current sense detector 48 includes a comparator 206, a P-FET 208, an N-FET 210, and a feedback circuit 212. During the normal mode of operation, the P-FET 208 is switched on, while the N-FET 210 is switched off. The comparator 206 includes a non-inverting input terminal 214 configured to receive a supply control input voltage 218, an inverting input terminal 216 configured to receive the feedback voltage 72 from the feedback circuit 212, and an output terminal 222. The comparator 206 operates to maintain the voltage at a node $N_{CAP}$ at the supply control voltage level of the supply control input voltage 218. More specifically, the comparator 206 is configured to generate a supply control output voltage 224 from the output terminal 222 based on the supply control input voltage 218 and the feedback voltage 72. If the supply control input voltage 218 and the feedback voltage 72 have unequal voltage levels, the comparator 206 drives the supply control output voltage 224 until the feedback voltage 72 at the inverting input terminal 216 is equal to the voltage level of the supply control input voltage 218 at the non-inverting input terminal 214. In turn, this results in a current being drawn across the P-FET 208. Since the decoupling capacitor 200 is coupled to the node $N_{CAP}$, the decoupling capacitor 200 is coupled to receive the supply control output voltage 224. The change in the supply control output voltage 224 results in a change in the current across the P-FET 208. The current across the P-FET 208 is tapped in order to provide the current sense signal 70 from the current sense detector 48.

The ripple current correction circuit 198 shown in FIG. 11 is operable to receive the current sense signal 70, a pulsed feedback signal 226 based on the pulsed output voltage 16, and the supply control input voltage 218. From the pulsed feedback signal 226, the supply control input voltage 218, and the current sense signal 70, the ripple current correction circuit 198 estimates the supply current level of the supply current 202. More specifically, the ripple current correction circuit 198 has a current estimation circuit 228 coupled to receive the pulsed feedback signal 226, the supply control input voltage 218, and the current sense signal 70. Based on the pulsed feedback signal 226, the supply control input voltage 218, and the current sense signal 70, the current estimation circuit 228 is configured to generate an estimated current signal 230 that is estimated to be directly proportional to the sense current level of the current sense signal 70. The estimated current signal 230 is received at an inverting terminal 232 of a comparator 234. A non-inverting terminal 235 of the comparator 234 is coupled to ground, while an output terminal 236 of the comparator 234 is coupled between an N-FET 238 and a P-FET 240.

During ET high power mode operation, the N-FET 238 is switched off, and the P-FET 240 is switched on. Since the sense signal level of the current sense signal 70 varies in accordance with the ripple variation in the supply current level of the supply current 202, a signal level of the estimated current signal 230 also has ripple variation. Since the estimated current signal 230 is received at the inverting terminal 232 of the comparator 234, this results in the generation of a current across the P-FET 240, which is the ripple correction current 204.

The ripple current correction circuit 198 is coupled so as to inject the ripple correction current 204 into the decoupling capacitor 200 in order to filter the ripple correction current 204. In this embodiment, the decoupling capacitor 200 provides a high-pass filter with a stopband that extracts the high-frequency ripple current from the ripple correction current 204. The decoupling capacitor 200 outputs the ripple correction current 204 such that the ripple correction current 204 reduces the ripple variation in the supply current level of the supply current 202, and therefore also the ripple variation of the supply voltage $V_{SUPPLY}$. In this particular embodiment, a node $N_{RIP}$ coupled between the N-FET 238 and the P-FET 240 is connected to the node $N_{CAP}$. The stopband, which in this case is a notch, provided by the decoupling capacitor 200 is centered at or near the signal frequency of the RF signal 30 (shown in FIG. 2). By applying the ripple correction current 204, after filtering, the ripple correction current 204 reduces the ripple variation in the supply current level of the supply current 202. The ripple correction current 204 is generated as an estimated mirror of the supply current 202. However, filtering by the decoupling capacitor 200 only injects high frequency portions of the ripple correction current 204 to avoid degrading power efficiency.

The RF switching converter 10 (shown in FIG. 3) needs to meet stringent noise standards within a transmission band for the RF signal 30. For example, when fewer than twelve (12) Resource Blocks (RBs) are being utilized in the RF signal 30 (shown in FIG. 2), the noise needs to be better than −138 dbm/Hz for LTE at a 30 MHz offset. In contrast, where the number of RBs is large, i.e., >twelve (12), noise only needs to be better than −120 dbm/Hz for LTE at a 30 MHz offset. Thus, some noise filtering can be sacrificed when the number of RBs is large. However, the greater the capacitance of the decoupling capacitor 200, the larger the currents drawn by the current sense detector 48. Accordingly, power efficiency is degraded by greater or larger capacitances at the decoupling capacitor 200. Consequently, it may be desirable to sacrifice some noise filtering when the number of RBs is large, in order to get better power efficiency. While this may not be done when the number of RBs is low, since the noise level requirements are stricter, noise filtering can be relaxed for a larger number of RBs.

As shown in FIG. 11, the switching controller 12 has a digital control unit 242 configured to receive an RB parameter 244 that indicates an integer number of RBs. The digital control unit 242 generates a control signal 246 in an activation state when the RB parameter 244 indicates that the integer number is less than an RB threshold value (i.e., twelve (12), in this example). However, the digital control unit 242 is configured to generate the control signal 246 in a deactivation state when the RB parameter 244 indicates that the integer number is greater than or equal to the RB threshold value (i.e., twelve (12), in this example). A switch 248 within a shunt-coupled circuit 250 is closed in response to the control signal 246 being provided in the activation state. In contrast, the switch 248 is opened in response to the control signal 246 being provided in the deactivation state.

The shunt-coupled circuit 250 shown in FIG. 11 is included in the switching controller 12, and in this particular embodiment, the feedback circuit 212 includes the shunt-coupled circuit 250.

The shunt-coupled circuit 250 has a second decoupling capacitor 252 and the switch 248. The switch 248 is coupled in series with the second decoupling capacitor 252, and is configured to be opened and closed, as explained above. The digital control unit 242 transmits the control signal 246 to the switch 248 so that the digital control unit 242 can open and close the switch 248 based on the RB parameter 244. When the RB parameter 244 indicates that the integer number of RBs is greater than or equal to the RB threshold value (i.e., twelve (12), in this example), noise level requirements are relaxed. Thus, a smaller capacitance may be used to increase power efficiency.

For example, the decoupling capacitor 200 has a first capacitance. The switch 248 is open in response to the RB parameter 244 indicating an integer number of RBs greater than the RB threshold value, and thus a second capacitance of the second decoupling capacitor 252 is not seen by the supply voltage $V_{SUPPLY}$. The ripple correction current 204 is not further filtered by the second decoupling capacitor 252 when the switch 248 is open. In this case, noise filtering is sacrificed for greater power efficiency.

However, in the feedback circuit 212, the shunt-coupled circuit 250 is coupled in shunt with respect to the decoupling capacitor 200. Thus, when the switch 248 is closed, the second capacitance of the second decoupling capacitor 252 is added to the first capacitance of the decoupling capacitor 200. As such, the second decoupling capacitor 252 further filters the ripple correction current 204 when the switch 248 is closed. The switch 248 is closed when the RB parameter indicates that the integer number of RBs is less than the RB threshold value (i.e., twelve (12), in this example), and thus, power efficiency is sacrificed for greater noise filtering.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) switching converter comprising:
a switching circuit operable to receive a power source voltage, the switching circuit being switchable so as to generate a pulsed output voltage from the power source voltage; and
a switching controller operable to receive a target average frequency value that identifies a target average frequency, the switching controller being configured to:
switch the switching circuit such that the pulsed output voltage has an average pulse frequency;
detect that the average pulse frequency of the pulsed output voltage during a time period differs from the target average frequency identified by the target average frequency value; and
reduce a difference between the average pulse frequency and the target average frequency identified by the target average frequency value.

2. The RF switching converter of claim 1 further comprising an RF filter configured to convert the pulsed output voltage into a supply voltage.

3. The RF switching converter of claim 2 wherein the RF filter comprises a power inductor configured to generate a power inductor current in response to the pulsed output voltage.

4. The RF switching converter of claim 3 wherein the RF filter is further configured to generate the supply voltage with an average DC supply voltage level set in accordance with a pulse frequency of the pulsed output voltage.

5. The RF switching converter of claim 1 further comprising a semiconductor substrate wherein the switching circuit and the switching controller are formed with the semiconductor substrate.

6. The RF switching converter of claim 1 wherein the switching controller is further operable to receive a threshold parameter and the switching controller is configured to:
set the average pulse frequency of the pulsed output voltage based on the threshold parameter; and
adjust the threshold parameter to reduce the difference between the average pulse frequency and the target average frequency identified by the target average frequency value.

7. The RF switching converter of claim 6 wherein to detect that the average pulse frequency of the pulsed output voltage during the time period differs from the target average frequency identified by the target average frequency value the switching controller is configured to:
set a pulse count integer to an initial value;
generate a clock signal from the pulsed output voltage; and
perform a count operation on the pulse count integer during the time period in accordance with the clock signal so that the pulse count integer has a final value upon expiration of the time period, wherein the final value is indicative of when the average pulse frequency during the time period differs from the target average frequency identified by the target average frequency value.

8. The RF switching converter of claim 7 wherein the initial value is equal to the target average frequency identified by the target average frequency value multiplied by a time duration of the time period and divided by a pulse ratio, and wherein the switching controller is further configured to:
generate the clock signal such that clock pulses of the clock signal are provided at the pulse ratio with respect to pulses of the pulsed output voltage;
perform the count operation on the pulse count integer in response to each one of the clock pulses, wherein the count operation is a decrement operation that decrements the pulse count integer as long as the pulse count integer is above a minimum value; and
set a flag bit to a first bit state in response to the final value of the pulse count integer being above the minimum value and set the flag bit to a second bit state antipodal to the first bit state in response to the final value of the pulse count integer being equal to the minimum value.

9. The RF switching converter of claim 8 wherein the switching controller comprises an accumulator operable to receive the threshold parameter and the flag bit, the accumulator being configured to adjust the threshold parameter such that the threshold parameter is increased by a step size in response to the flag bit being in the first bit state and the threshold parameter is decreased by the step size in response to the flag bit being in the second bit state.

10. The RF switching converter of claim 9 wherein the accumulator is further operable to receive a noise adjustment selection bit, and the accumulator is further configured to set the step size to a first integer in response to the noise adjustment selection bit being in the first bit state and is configured to set the step size to a second integer in response to the noise adjustment selection bit being in the second bit state.

11. The RF switching converter of claim 8 wherein the switching controller is further operable to receive a trigger signal in an activation state or in a deactivation state, and wherein the switching controller is configured to begin the time period in response to the trigger signal being in the activation state.

12. The RF switching converter of claim 11 wherein the trigger signal is a time slot initiation signal.

13. The RF switching converter of claim 7 wherein:
the switching controller is further operable to receive a pulse ratio parameter that identifies a pulse ratio; and
the switching controller is configured to generate the clock signal such that clock pulses of the clock signal are provided at the pulse ratio identified by the pulse ratio parameter with respect to the pulses of the pulsed output voltage.

14. The RF switching converter of claim 7 wherein:
the pulse ratio identified by the pulse ratio parameter is selectable to be an integer selected from a group consisting of one (1), two (2), and four (4); and
the switching controller is further configured to set a time duration of the time period to approximately a first time slot size in response to the pulse ratio parameter being 1, a second time slot size that is greater than the first time slot size in response to the pulse ratio parameter being 2, and double the second time slot size in response to the pulse ratio parameter being 4.

15. The RF switching converter of claim 14 wherein the first time slot size is 0.5 milliseconds (ms) and the second time slot size is 0.667 ms.

16. The RF switching converter of claim 7 wherein the switching controller is further configured to:
calculate an upper limit for the final value based on the target average frequency value and a pulse ratio parameter that identifies a pulse ratio;
calculate a lower limit for the final value based on the target average frequency value and the pulse ratio parameter;
generate the clock signal such that clock pulses of the clock signal have the pulse ratio with respect to pulses of the pulsed output voltage; and
perform the count operation on the pulse count integer in response to each one of the clock pulses, wherein the count operation is an increment operation that increments the pulse count integer.

17. The RF switching converter of claim 16 wherein the switching controller is further configured to generate a pulse count integer voltage having a first voltage level indicative of the final value, an upper limit voltage having a second voltage level indicative of the upper limit, and a lower limit voltage having a third voltage level indicative of the lower limit, the switching controller comprising:
a first comparator configured to compare the upper limit voltage and the pulse count integer voltage so as to generate a first comparator signal in an activation state in response to the first voltage level being greater than the second voltage level;
a second comparator configured to compare the lower limit voltage and the pulse count integer voltage so as to generate a second comparator signal in an activation state in response to the first voltage level being lower than the third voltage level; and
an accumulator being configured to receive the threshold parameter, the first comparator signal, and the second comparator signal, wherein the accumulator is configured to adjust the threshold parameter by increasing the threshold parameter by a step size in response to the first comparator signal being in the activation state and decreasing the threshold parameter by the step size in response to the second comparator signal being in the activation state.

18. The RF switching converter of claim 7 wherein the count operation is an increment operation that increments the pulse count integer.

19. The RF switching converter of claim 18 wherein the switching controller is further operable to receive a gain error parameter that identifies a gain error and wherein the switching controller comprises:
  a subtractor operable to receive the pulse count integer at the final value, the subtractor being configured to subtract the target average frequency value from the final value of the pulse count integer so as to generate a count error value;
  a multiplier configured to multiply the gain error parameter with the count error value so as to generate an error value; and
  an accumulator configured to adjust the threshold parameter by adding the error value or a rounded value of the error value to the threshold parameter.

20. The RF switching converter of claim 1 wherein the switching controller comprises a bang-bang controller (BBC) and an average frequency controller (AFC) operable to receive a threshold parameter related to the average pulse frequency, wherein:
  the AFC is configured to:
    detect that the average pulse frequency of the pulsed output voltage during the time period differs from the target average frequency identified by the target average frequency value; and
    adjust the threshold parameter to reduce the difference between the average pulse frequency and the target average frequency identified by the target average frequency value; and
  the BBC is configured to switch the switching circuit at a switching frequency that is based on the threshold parameter.

21. The RF switching converter of claim 20 wherein the switching circuit further comprises a P-type field effect transistor (P-FET) operable to receive the power source voltage and an N-type field effect transistor (N-FET) operable to receive a reference voltage, wherein the BBC is configured to:
  switch the P-FET between an on state and an off state, the P-FET being configured to pull the pulsed output voltage toward the power source voltage in the on state; and
  switch the N-FET between the on state and the off state, the N-FET being configured to pull the pulsed output voltage toward the reference voltage in the on state.

22. The RF switching converter of claim 21 further comprising an RF filter configured to convert the pulsed output voltage into a supply voltage and having an inductor that produces a current in response to the pulsed output voltage, and wherein:
  the BBC is operable to receive the threshold parameter from the AFC, a current sense signal having a sense signal level indicative of a current level of the current across the inductor, wherein to switch the switching circuit such that the pulsed output voltage has the average pulse frequency, the BBC is configured to:
    set a first threshold signal level based on the threshold parameter;
    set a second threshold signal level based on the threshold parameter, wherein the second threshold signal level is lower than the first threshold signal level;
    turn on the P-FET and turn off the N-FET in response to the sense signal level being above the first threshold signal level; and
    turn off the P-FET and turn on the N-FET in response to the sense signal level being below the second threshold signal level.

23. The RF switching converter of claim 22 wherein the switching circuit further comprises a charge pump that is switchable such that the pulsed output voltage is provided in a first high voltage state greater than a power source voltage level of the power source voltage and a second high voltage state greater than the first high voltage state, the switching controller being configured to switch the charge pump to generate the pulsed output voltage at the first high voltage state and to switch the charge pump to generate the pulsed output voltage at the second high voltage state.

24. The RF switching converter of claim 23 wherein the BBC is further operable in a first bang-bang mode and in a second bang-bang mode wherein:
  the BBC is configured to:
    set a third threshold signal level that is higher than the first threshold signal level; and
    set a fourth threshold signal level that is higher than the third threshold signal level, wherein the second threshold signal level is lower than the first threshold signal level;
  in the first bang-bang mode, the BBC is configured to only:
    turn on the P-FET and turn off the N-FET in response to the sense signal level being above the first threshold signal level; and
    turn off the P-FET and turn on the N-FET in response to the sense signal level being below the second threshold signal level; and
  in the second bang-bang mode, the BBC is configured to:
    turn on the P-FET and turn off the N-FET in response to the sense signal level being above the first threshold signal level;
    turn off the P-FET and turn on the N-FET in response to the sense signal level being below the second threshold signal level;
    switch the charge pump such that the pulsed output voltage is provided in the first high voltage state in response to the sense signal level being above the third threshold signal level; and
    switch the charge pump such that the pulsed output voltage is provided in the second high voltage state in response to the sense signal level being above the fourth threshold signal level.

25. The RF switching converter of claim 22 wherein the inductor comprises a power inductor configured to produce the current in response to the pulsed output voltage.

26. A radio frequency (RF) amplification device comprising:
  an RF amplification circuit operable to receive a supply voltage and an RF signal, wherein the RF amplification circuit is configured to amplify the RF signal using the supply voltage;
  a switching circuit operable to receive a power source voltage, the switching circuit being switchable so as to generate a pulsed output voltage from the power source voltage;
  an RF filter operable to receive the pulsed output voltage, wherein the RF filter is configured to convert the pulsed output voltage into the supply voltage; and a switching controller operable to receive a target average frequency value, the switching controller being configured to:
    switch the switching circuit such that the pulsed output voltage has an average pulse frequency;
    detect that the average pulse frequency of the pulsed output voltage during a time period differs from the target average frequency identified by the target average frequency value; and
    reduce a difference between the average pulse frequency and the target average frequency identified by the target average frequency value.

27. The RF amplification device of claim 26 wherein the switching controller is configured to switch the switching circuit such that the RF amplification circuit is configured to amplify the RF signal when the RF signal is encoded using orthogonal frequency division multiple access multiplexing (OFDMA).

28. A method of converting a power source voltage into a supply voltage for a radio frequency (RF) amplification device comprising:
    generating a pulsed output voltage from the power source voltage, wherein the pulsed output voltage has an average pulse frequency;
    filtering the pulsed output voltage to convert the pulsed output voltage into the supply voltage;
    receiving a target average frequency value that identifies a target average frequency;
    detecting that the average pulse frequency of the pulsed output voltage during a time period differs from the target average frequency identified by the target average frequency value; and
    reducing a difference between the average pulse frequency and the target average frequency identified by the target average frequency value.

* * * * *